(12) United States Patent
Chiu et al.

(10) Patent No.: US 10,804,161 B2
(45) Date of Patent: Oct. 13, 2020

(54) CMOS FINFET STRUCTURES INCLUDING WORK-FUNCTION MATERIALS HAVING DIFFERENT PROPORTIONS OF CRYSTALLINE ORIENTATIONS AND METHODS OF FORMING THE SAME

(71) Applicant: Taiwan Semiconductor Manufacturing Company, Ltd., Hsinchu (TW)

(72) Inventors: Ya-Wen Chiu, Tainan (TW); Da-Yuan Lee, Jhubei (TW); Hsien-Ming Lee, Changhua (TW); Kai-Cyuan Yang, Tainan (TW); Yu-Sheng Wang, Tainan (TW); Chih-Hsiang Fan, Hsinchu (TW); Kun-Wa Kuok, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 152 days.

(21) Appl. No.: 15/803,486

(22) Filed: Nov. 3, 2017

(65) Prior Publication Data

US 2018/0174922 A1 Jun. 21, 2018

Related U.S. Application Data

(60) Provisional application No. 62/434,958, filed on Dec. 15, 2016.

(51) Int. Cl.
*H01L 21/8238* (2006.01)
*H01L 27/092* (2006.01)
(Continued)

(52) U.S. Cl.
CPC ........ *H01L 21/823821* (2013.01); *H01L 21/823814* (2013.01); *H01L 21/823828* (2013.01);
(Continued)

(58) Field of Classification Search
CPC ..... H01L 21/823821; H01L 21/823814; H01L 21/823828; H01L 27/0924; H01L 29/4966; H01L 29/66545; H01L 29/66795
See application file for complete search history.

(56) References Cited

U.S. PATENT DOCUMENTS

2011/0108924 A1* 5/2011 Suzuki ............ H01L 21/28088
257/369
2016/0225675 A1* 8/2016 Shen .............. H01L 21/823842

OTHER PUBLICATIONS

Gate sizing: finFETs vs 32nm bulk MOSFETs (Swahn et al.) DAC '06 Proceedings of the 43rd annual Design Automation Conference pp. 528-531; San Francisco, CA, USA—Jul. 24-28, 2006 (Year: 2006).*

* cited by examiner

*Primary Examiner* — Matthew E. Gordon
(74) *Attorney, Agent, or Firm* — Slater Matsil, LLP

(57) ABSTRACT

A method includes forming a first transistor, which includes forming a first gate dielectric layer over a first channel region in a substrate and forming a first work-function layer over the first gate dielectric layer, wherein forming the first work-function layer includes depositing a work-function material using first process conditions to form the work-function material having a first proportion of different crystalline orientations and forming a second transistor, which includes forming a second gate dielectric layer over a second channel region in the substrate and forming a second work-function layer over the second gate dielectric layer, wherein forming the second work-function layer includes depositing the work-function material using second process conditions to form the work-function material having a second proportion of different crystalline orientations.

20 Claims, 23 Drawing Sheets

(51) Int. Cl.
  *H01L 29/49* (2006.01)
  *H01L 29/66* (2006.01)
  *H01L 29/78* (2006.01)
  *H01L 29/51* (2006.01)
(52) U.S. Cl.
  CPC ...... *H01L 27/0924* (2013.01); *H01L 29/4966* (2013.01); *H01L 29/66545* (2013.01); *H01L 29/66795* (2013.01); *H01L 29/785* (2013.01); *H01L 21/823842* (2013.01); *H01L 29/513* (2013.01); *H01L 29/517* (2013.01)

US 10,804,161 B2

CMOS FINFET STRUCTURES INCLUDING WORK-FUNCTION MATERIALS HAVING DIFFERENT PROPORTIONS OF CRYSTALLINE ORIENTATIONS AND METHODS OF FORMING THE SAME

PRIORITY CLAIM AND CROSS-REFERENCE

This application claims the benefit of U.S. Provisional Application No. 62/434,958, filed on Dec. 15, 2016, and entitled "FinFET Structures and Methods of Forming the Same", which application is hereby incorporated herein by reference.

BACKGROUND

Semiconductor devices are used in a large number of electronic devices, such as computers, cell phones, and others. Semiconductor devices include integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, Fin Field-Effect Transistors (FinFETs) or multiple gate transistors are being researched and implemented. However, with this new device structure and the continuous shrinking of even FinFETs, new challenges are being discovered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
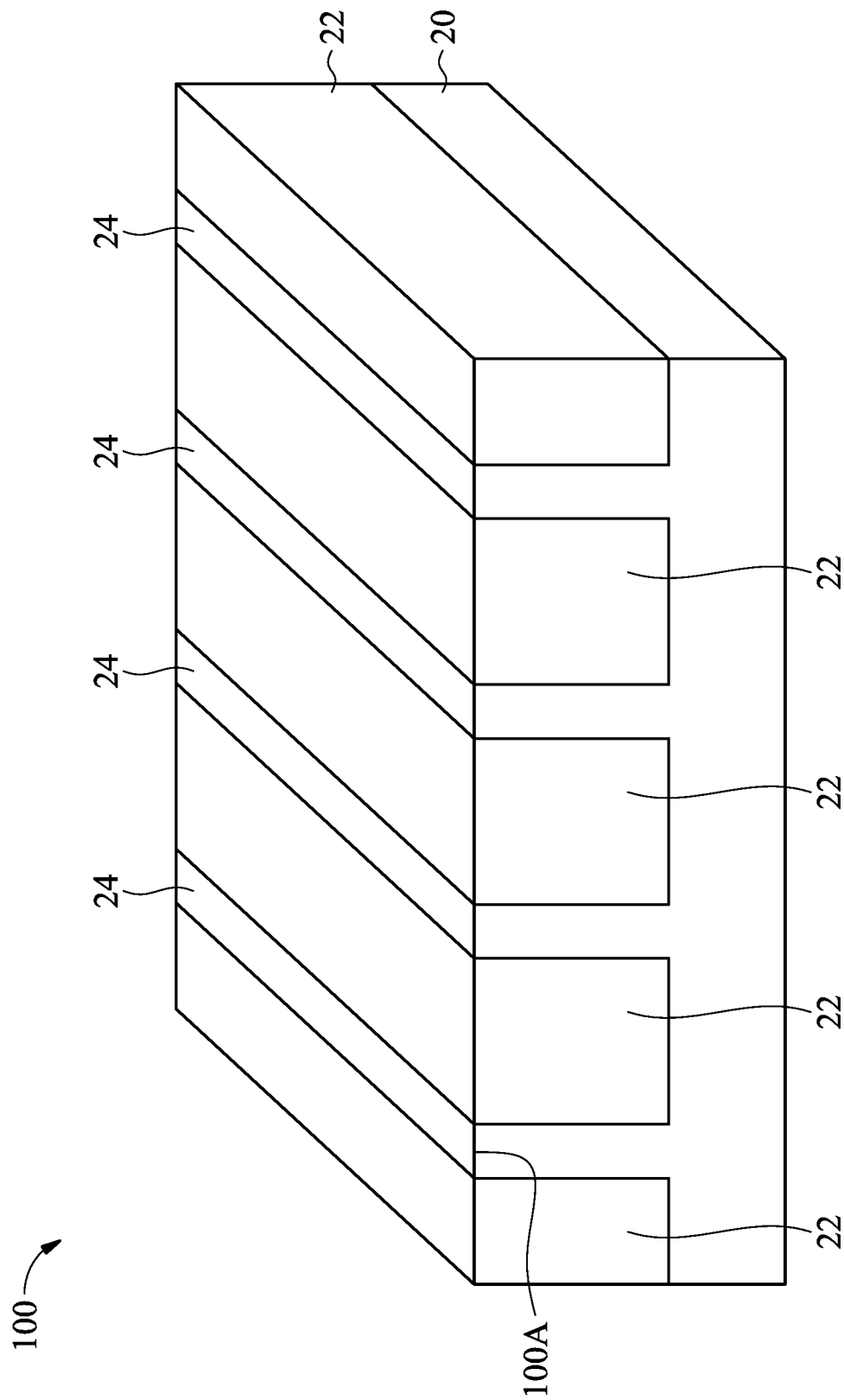
FIGS. 1 through 20 illustrate cross-sectional views and perspective views of intermediate stages in the formation of a Fin Field-Effect Transistor (FinFET) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. The intermediate stages of forming the FinFETs are illustrated in accordance with some embodiments. In particular, methods are described herein of forming a work-function layer with desired amounts of different crystalline orientations. Other modifications that may be made are contemplated within the scope of other embodiments. Although method embodiments are discussed in a particular order, various other method embodiments may be performed in any logical order and may include fewer or more steps than described herein. For example, the fins may be patterned by any suitable method, such as using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, may then be used to pattern the fins. Throughout the various views and illustrative embodiments, like reference numbers are used to designate like elements. In the illustrated exemplary embodiments, the formation of a FinFET is used an example to explain the embodiments of the present disclosure. Planar transistors may also adopt the concept of the present disclosure.

FIG. 1 illustrates a perspective view of an initial structure. The initial structure includes wafer 100, which further includes substrate 20. The substrate 20 may be a semiconductor substrate, such as a bulk semiconductor, a semiconductor-on-insulator (SOI) substrate, or the like, which may be doped (e.g., with a p-type or an n-type dopant) or undoped. The substrate 20 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or a glass substrate. Other substrates, such as a multi-layered or gradient substrate may also be used. In some embodiments, the semiconductor material of the substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Isolation regions 22 such as Shallow Trench Isolation (STI) regions may be formed to extend from a top surface of substrate 20 into substrate 20, wherein the top surface of substrate 20 is a major surface 100A of wafer 100. The portions of substrate 20 between neighboring STI regions 22 are referred to as semiconductor strips 24. The top surfaces of semiconductor strips 24 and the top surfaces of STI regions 22 may be substantially level with each other in some embodiments.

STI regions 22 may be an oxide, such as silicon oxide, a nitride, the like, or a combination thereof. STI regions 22 may be formed by a high density plasma chemical vapor deposition (HDP-CVD), a flowable CVD (FCVD) (e.g., a CVD-based material deposition in a remote plasma system and post-curing to convert it to another material, such as an oxide), a spin-on process, a conformal oxide process, the like, or a combination thereof. In other embodiments, other insulation materials formed by any acceptable process may be used. STI regions 22 may include a liner, such as a liner oxide (not shown). The liner oxide may be formed of a thermal oxide formed through a thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 22 may also include a dielectric material over the liner oxide, wherein the dielectric material may be formed of Flowable Chemical Vapor Deposition (FCVD), spin-on, or the like.

Figure 2:
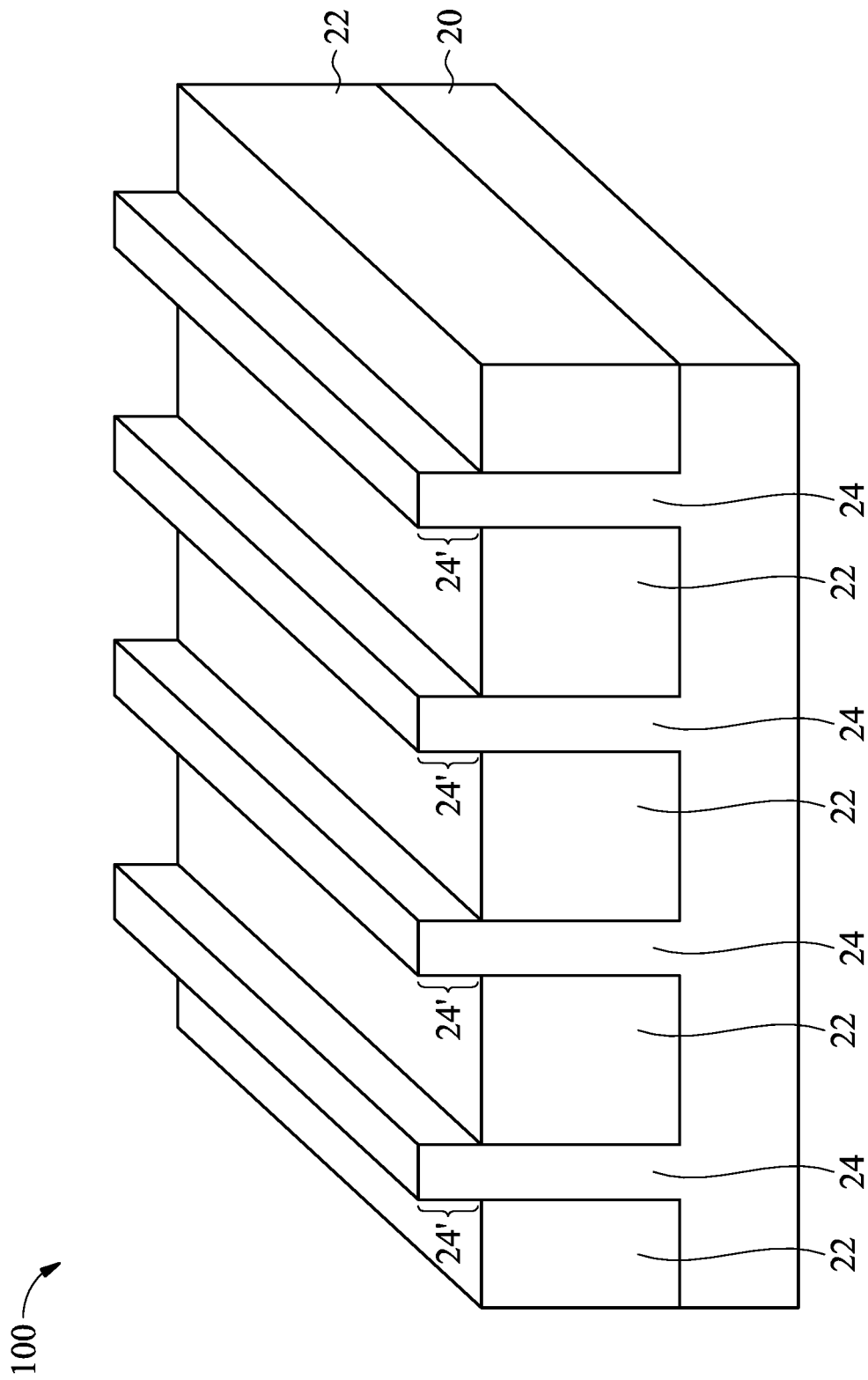

Referring to FIG. 2, STI regions 22 are recessed, so that top portions of semiconductor strips 24 protrude higher than the top surfaces of STI regions 22 to form protruding fins 24'. The etching may be performed using a dry etching process, wherein HF3 and NH3 are used as the etching gases. During the etching process, plasma may be generated. Argon may also be included. The recessing of STI regions 22 may also be performed using a wet etch process. The etching chemical may include diluted HF, for example.

The process described with respect to FIGS. 1 and 2 is just one example of how the semiconductor strips 24 and protruding fins 24' may be formed. In some embodiments, a dielectric layer can be formed over a top surface of the substrate 20; trenches can be etched through the dielectric layer; homoepitaxial structures can be epitaxially grown in the trenches; and the dielectric layer can be recessed such that the homoepitaxial structures protrude from the dielectric layer to form protruding fins. In some embodiments, heteroepitaxial structures can be used for the semiconductor strips 24. For example, the semiconductor strips 24 in FIG. 1 can be recessed, and a material different from the semiconductor strips 24 may be epitaxially grown in their place. Other methods and processes may be used to form the fins 24'.

Figure 3:
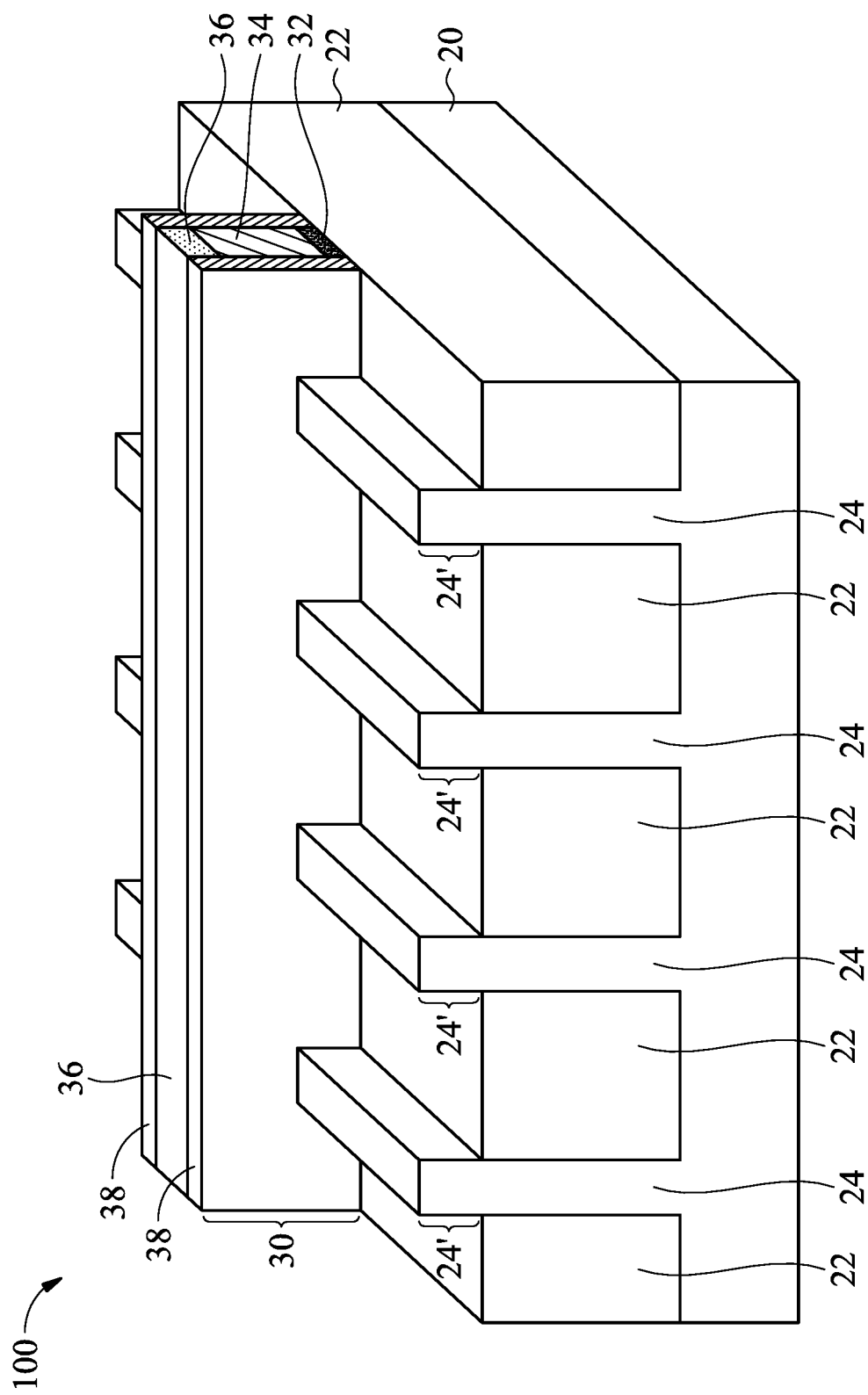

Referring to FIG. 3, dummy gate stack 30 is formed on the top surfaces and the sidewalls of protruding fins 24'. Dummy gate stack 30 may include gate dielectric 32 and dummy gate electrode 34 over dummy gate dielectric 32. The dummy gate dielectric 32 may be, for example, silicon oxide, silicon nitride, a combination thereof, or the like, and may be deposited or thermally grown according to acceptable techniques. Dummy gate electrode 34 may be a conductive material, such as polycrystalline-silicon (polysilicon), polycrystalline silicon-germanium (poly-SiGe), metallic nitrides, metallic silicides, metallic oxides, metals, or the like. In one embodiment, amorphous silicon is deposited and recrystallized to create polysilicon. Dummy gate electrode 34 may be deposited by physical vapor deposition (PVD), CVD, sputter deposition, or other techniques known and used in the art for depositing conductive materials. Dummy gate electrode 34 may be made of other materials that have a high etching selectivity from the etching of isolation regions. In some cases, dummy gate electrode 34 may be deposited over the dummy gate dielectric 32 and then planarized, such as by a CMP. Dummy gate stack 30 may also include one (or a plurality of) hard mask layer 36 over dummy gate electrode 34. Hard mask layer 36 may be formed of silicon nitride (SiN), silicon oxynitride (SiON), silicon carbon nitride (SiCN), or the like. Dummy gate stack 30 may cross over a single one or a plurality of protruding fins 24' and/or STI regions 22. Dummy gate stack 30 may also have a lengthwise direction substantially perpendicular to the lengthwise direction of protruding fins 24'.

Next, gate spacers 38 are formed on the sidewalls of dummy gate stack 30. In accordance with some embodiments of the present disclosure, gate spacers 38 are formed of a dielectric material such as silicon carbon oxynitride (SiCN), silicon nitride, or the like, and may have a single-layer structure or a multi-layer structure including a plurality of dielectric layers.

Figure 4:
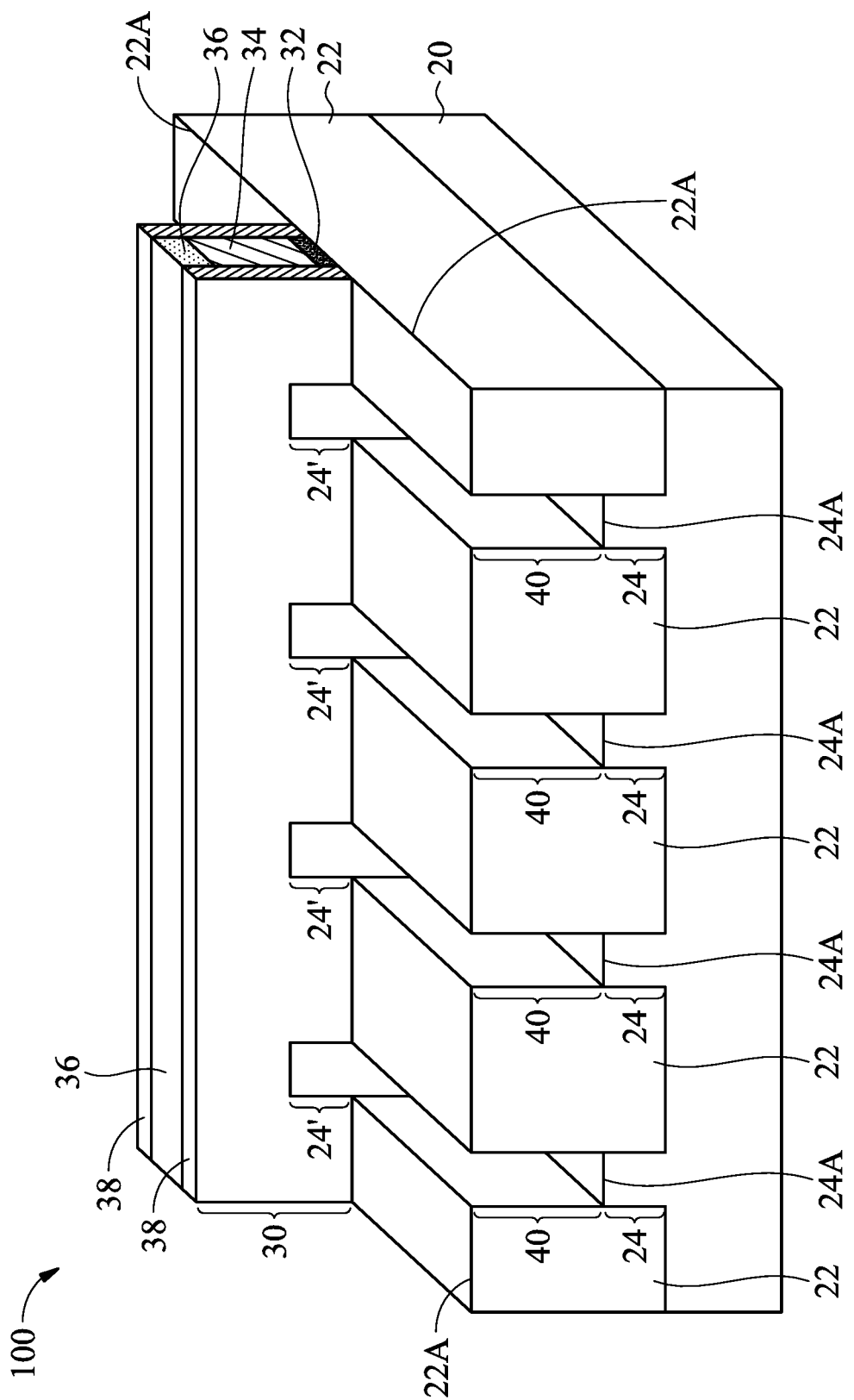

An etching step (referred to as source/drain recessing hereinafter) is then performed to etch the portions of protruding fins 24' that are not covered by dummy gate stack 30 and gate spacers 38, resulting in the structure shown in FIG. 4. The recessing may be anisotropic, and hence the portions of fins 24' directly underlying dummy gate stack 30 and gate spacers 38 are protected, and are not etched. The top surfaces 24A of the recessed semiconductor strips 24 may be lower than the top surfaces 22A of STI regions 22 in accordance with some embodiments. Recesses 40 are accordingly formed between STI regions 22. Recesses 40 are located on opposite sides of dummy gate stack 30.

Figure 5:
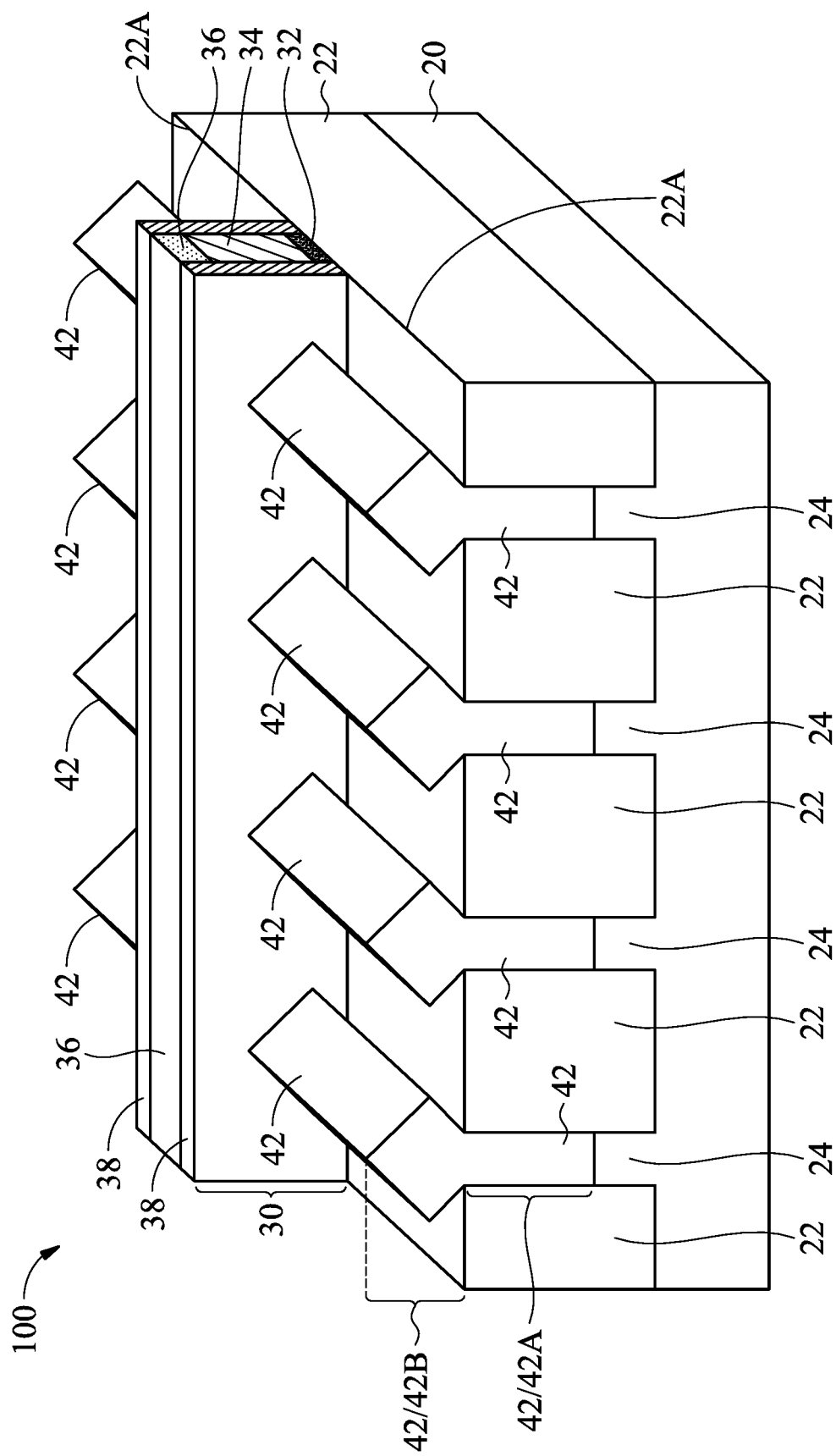

Next, epitaxy regions 42 (source/drain regions) are formed by selectively growing a semiconductor material in recesses 40, resulting in the structure in FIG. 5. In some embodiments, some adjacent epitaxy regions 42 may grow together to form a merged epitaxial structure. In some embodiments, epitaxy regions 42 include silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, epitaxy regions 42 may include SiGe, SiGeB, Ge, GeSn, or the like. In some cases, epitaxy regions 42 of an n-type FinFET may include silicon, SiC, SiCP, SiP, or the like. In some embodiments of the present disclosure, epitaxy regions 42 comprise III-V compound semiconductors such as GaAs, InP, GaN, InGaAs, InAlAs, GaSb, AlSb, AlAs, AlP, GaP, combinations thereof, or multi-layers thereof. After recesses 40 are filled with epitaxy regions 42, the further epitaxial growth of epitaxy regions 42 causes epitaxy regions 42 to expand horizontally, and facets may be formed.

After the epitaxy step, epitaxy regions 42 may be further implanted with a p-type or an n-type impurity to form source and drain regions, which are also denoted using reference numeral 42. In some embodiments, the implantation step is skipped since epitaxy regions 42 are in-situ doped with the p-type or n-type impurity during the epitaxy. Epitaxy regions 42 include lower portions 42A that are formed in STI regions 22, and upper portions 42B that are formed over the top surfaces 22A of STI regions 22. Lower portions 42A, whose sidewalls are shaped by the shapes of recesses 40 (FIG. 4), may have (substantially) straight edges, which may also be substantial vertical edges that are substantially perpendicular to the major surfaces of substrate 20.

Figure 6:
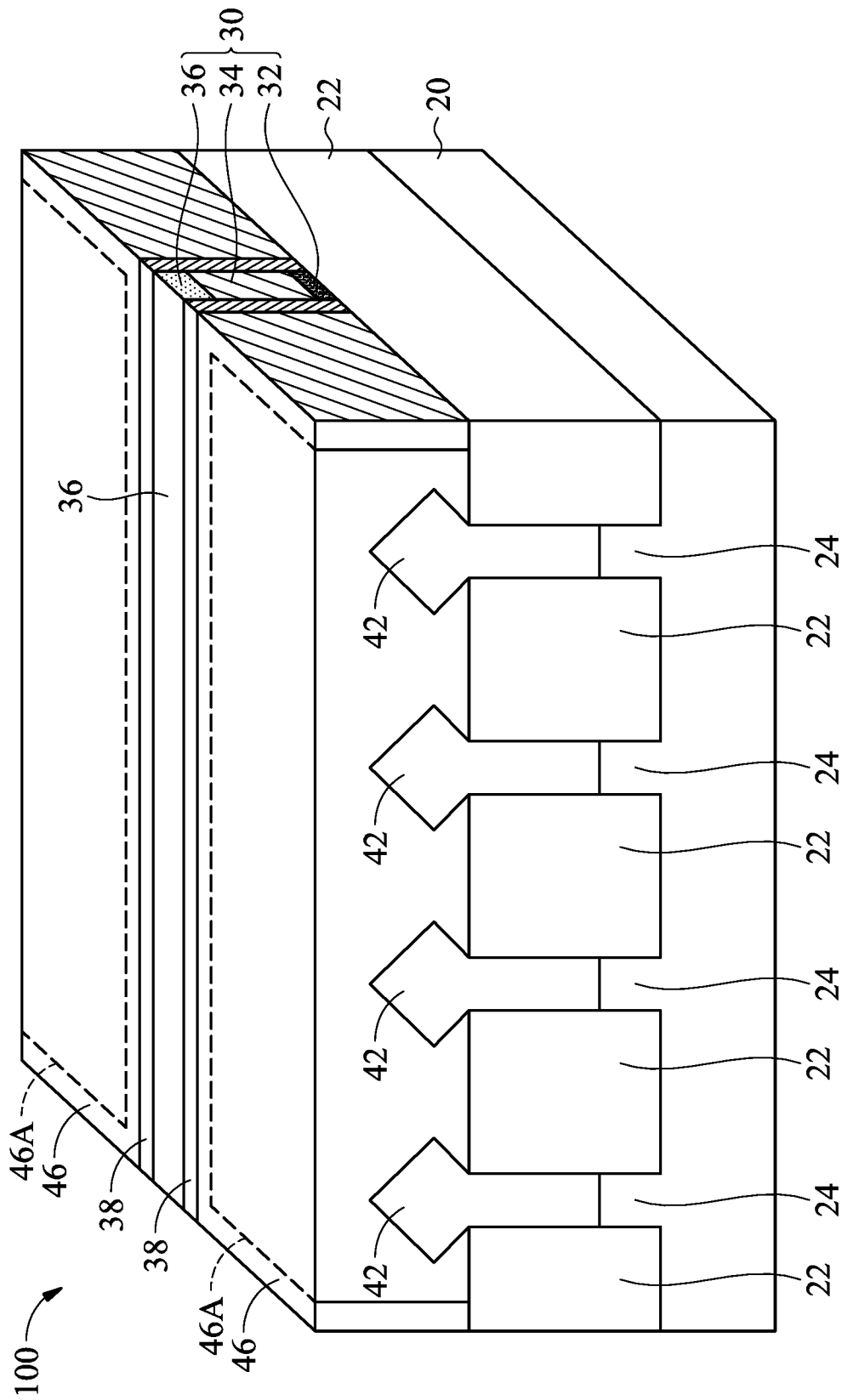

FIG. 6 illustrates a perspective view of the structure after Inter-Layer Dielectric (ILD) 46 is formed. In accordance with some embodiments of the present disclosure, a buffer oxide layer (not shown) and a Contact Etch Stop Layer (CESL, not shown) are formed on source and drain regions 42 before the formation of ILD 46. The buffer oxide layer may be formed of silicon oxide, and the CESL may be formed of silicon nitride, silicon carbo-nitride, or the like. The buffer oxide layer and the CESL may be formed using a conformal deposition method such as Atomic Layer Deposition (ALD), for example. ILD 46 may include a dielectric material formed using, for example, FCVD, spin-on coating, CVD, plasma-enhanced CVD (PECVD), or other deposition methods. ILD 46 may also be formed of Phospho-Silicate glass (PSG), Boro-Silicate Glass (BSG), Boron-Doped Phospho-Silicate Glass (BPSG), undoped Silicate Glass (USG), Tetra Ethyl Ortho Silicate (TEOS) oxide, or the like. A Chemical Mechanical Polish (CMP) may be performed to level the top surfaces of ILD 46, dummy gate stack 30, and gate spacers 38 with each other.

In a subsequent step, portions 46A of ILD 46 are removed to form contact openings. Source/drain silicide regions 48 (FIG. 7A) are then formed on the surfaces of epitaxy regions 42. The formation process includes depositing a metal layer into the contact openings, and performing an anneal to react the metal layer with the exposed surface portions of epitaxy regions 42, so that silicide regions 48 are formed. In some embodiments, unreacted portions of the metal layer are removed. In some embodiments, the unreacted portions of the metal layer remain unremoved. A conductive material such as tungsten is then filled into the contact openings to form contact plugs 50, as shown in FIG. 7A.

Figure 7A:
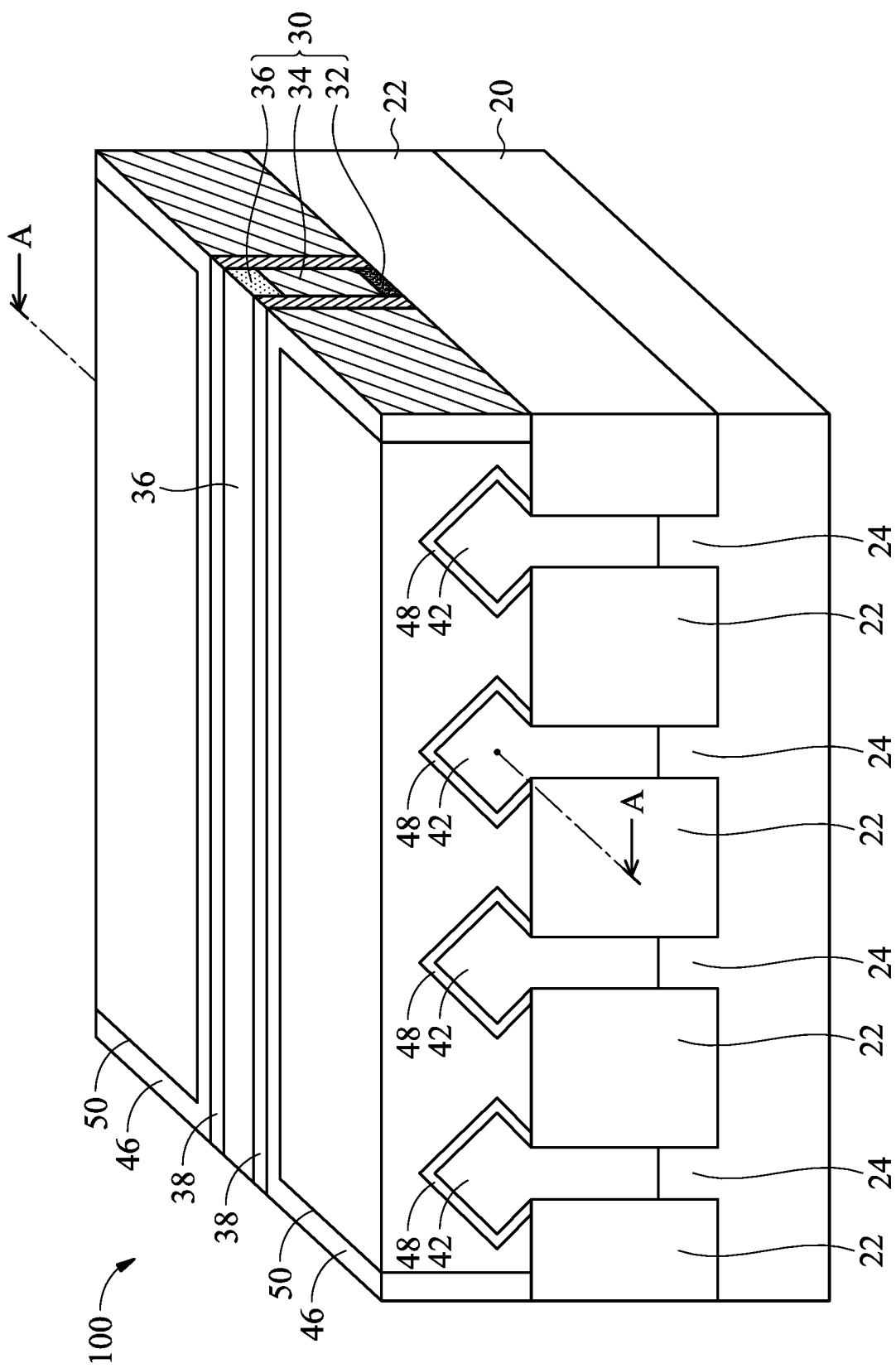
Figure 7B:
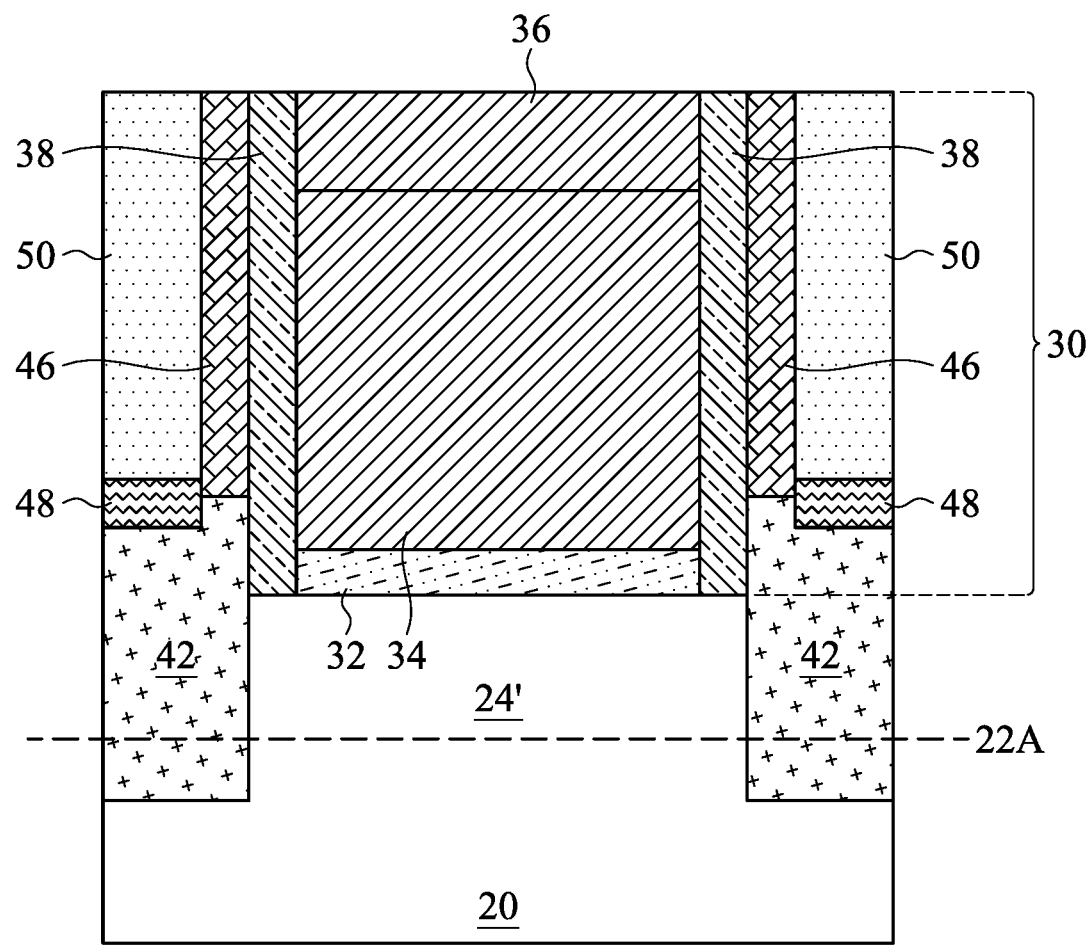

A cross-sectional view of the structure shown in FIG. 7A is illustrated in FIG. 7B, wherein the cross-sectional view is obtained from the vertical plane containing line A-A in FIG. 7A. Next, the dummy gate stack 30 including hard mask layer 36, dummy gate electrode 34 and dummy gate dielectric 32 are replaced with a metal gate and a replacement gate dielectric, as shown in FIGS. 8 through 18. The cross-sectional views shown in FIGS. 8 through 18 are obtained from the same vertical plane containing line A-A in FIG. 7. In FIGS. 8 through 18, the top surfaces 22A of STI regions 22 are illustrated as a dotted line for reference, and semiconductor fins 24' in the channel region extend above the top surfaces 22A.

Figure 8:
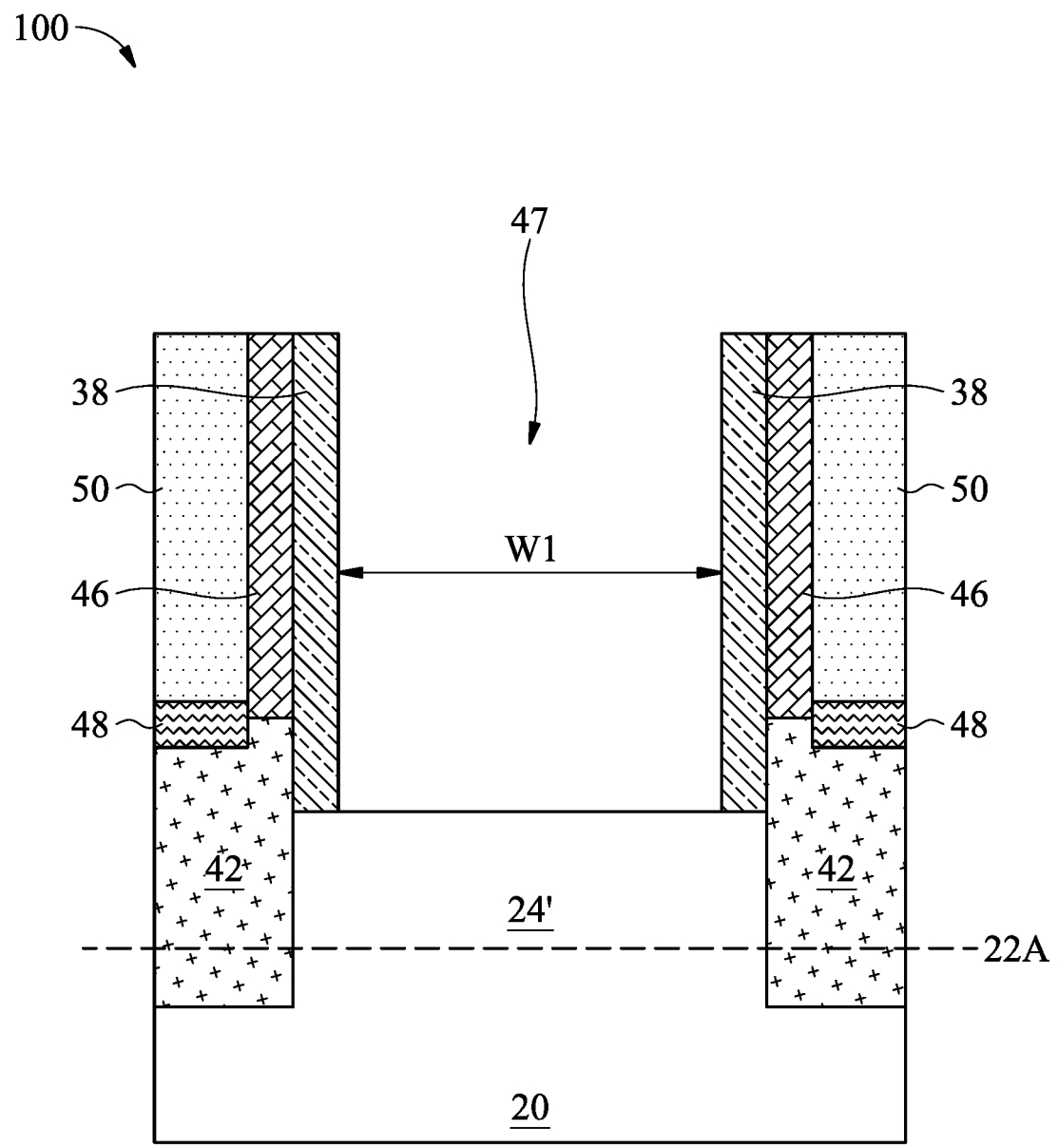

Hard mask layer 36, dummy gate electrode 34, and dummy gate dielectric 32 of dummy gate stack 30 as shown in FIGS. 7A and 7B are then removed, forming opening 47 as shown in FIG. 8. The top surfaces and the sidewalls of protruding fins 24' are exposed to opening 47. In some embodiments, dummy gate stack 30 is removed by an anisotropic dry etch process. For example, the etching process may include a dry etch process using reaction gas(es) that selectively etch dummy gate stack 30 without etching the ILD 46 or the gate spacers 38. In some cases, dummy gate dielectric 32 may be used as an etch stop layer when dummy gate electrode 34 is etched.

Figure 9:
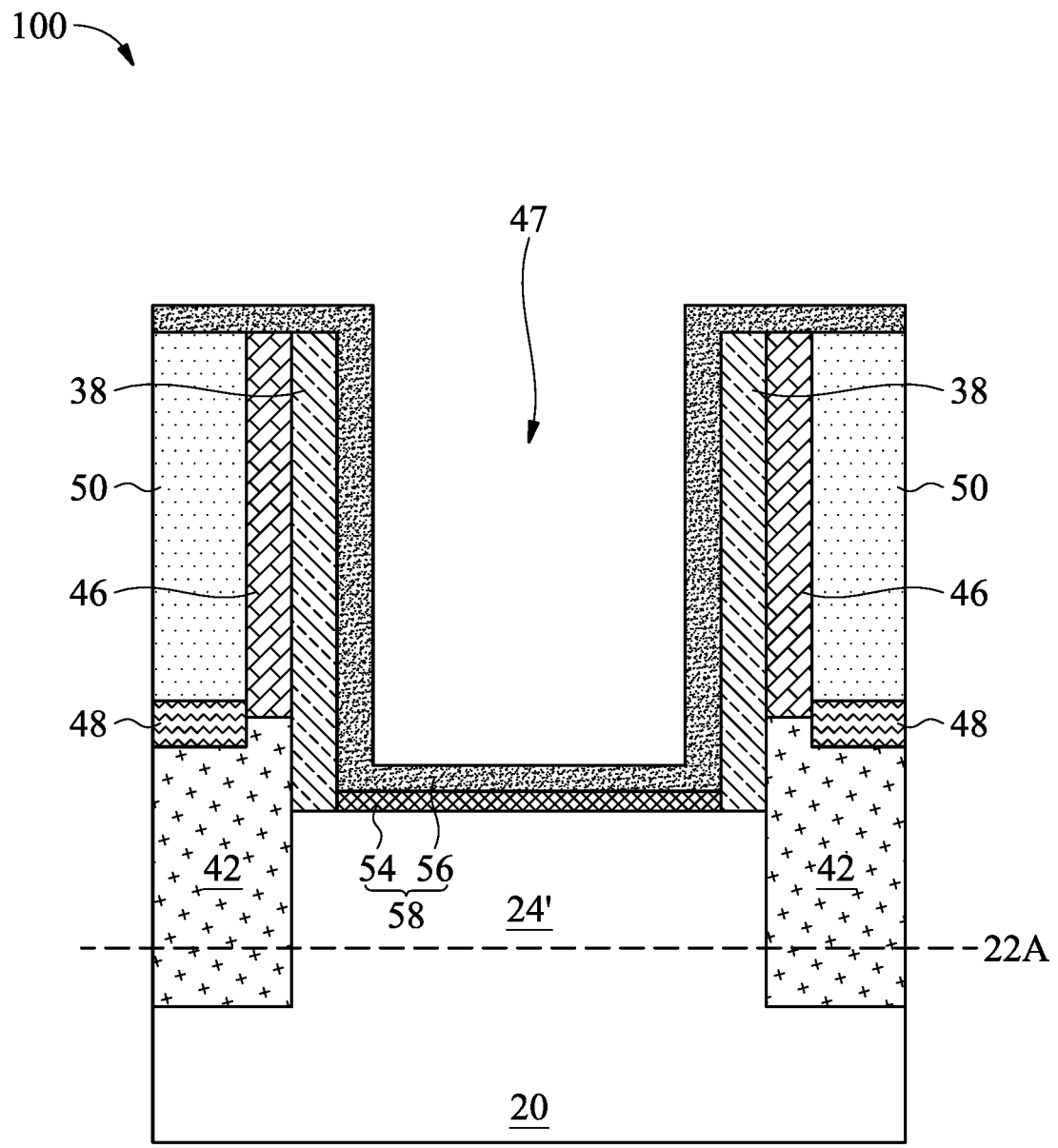

Next, referring to FIG. 9, gate dielectric 58 is formed which extends into opening 47. In some embodiments, gate dielectric 58 includes more than one dielectric layers. As an example, gate dielectric 58 shown in FIG. 9 to FIG. 18 includes Interfacial Layer (IL) 54 as a lower part. IL 54 is formed on the exposed surfaces of protruding fins 24'. IL 54 may include an oxide layer such as a silicon oxide layer, which may be formed through the thermal oxidation of protruding fins 24', a chemical oxidation process, or a deposition process. In some cases, IL 54 may include a silicon nitride layer, and in some cases IL 54 may include one or more layers of silicon oxide, silicon nitride, or another material. Gate dielectric 58 may also include high-k dielectric layer 56 formed over IL 54. High-k dielectric layer 56 may include a metal oxide or a silicate of Hf, Al, Zr, La, Mg, Ba, Ti, Pb, or combinations thereof. The dielectric constant (k-value) of the high-k dielectric material is higher than 3.9, and may be higher than about 7.0, and in some cases may be as high as 21.0 or higher. High-k dielectric layer 56 is overlying, and may contact, IL 54. High-k dielectric layer 56 is formed as a conformal layer, and extends on the sidewalls of protruding fins 24' and the top surface and the sidewalls of gate spacers 38. In some embodiments, formation methods of dielectric layer 56 may include Molecular-Beam Deposition (MBD), Atomic Layer Deposition (ALD), PECVD, and the like.

Figure 10:
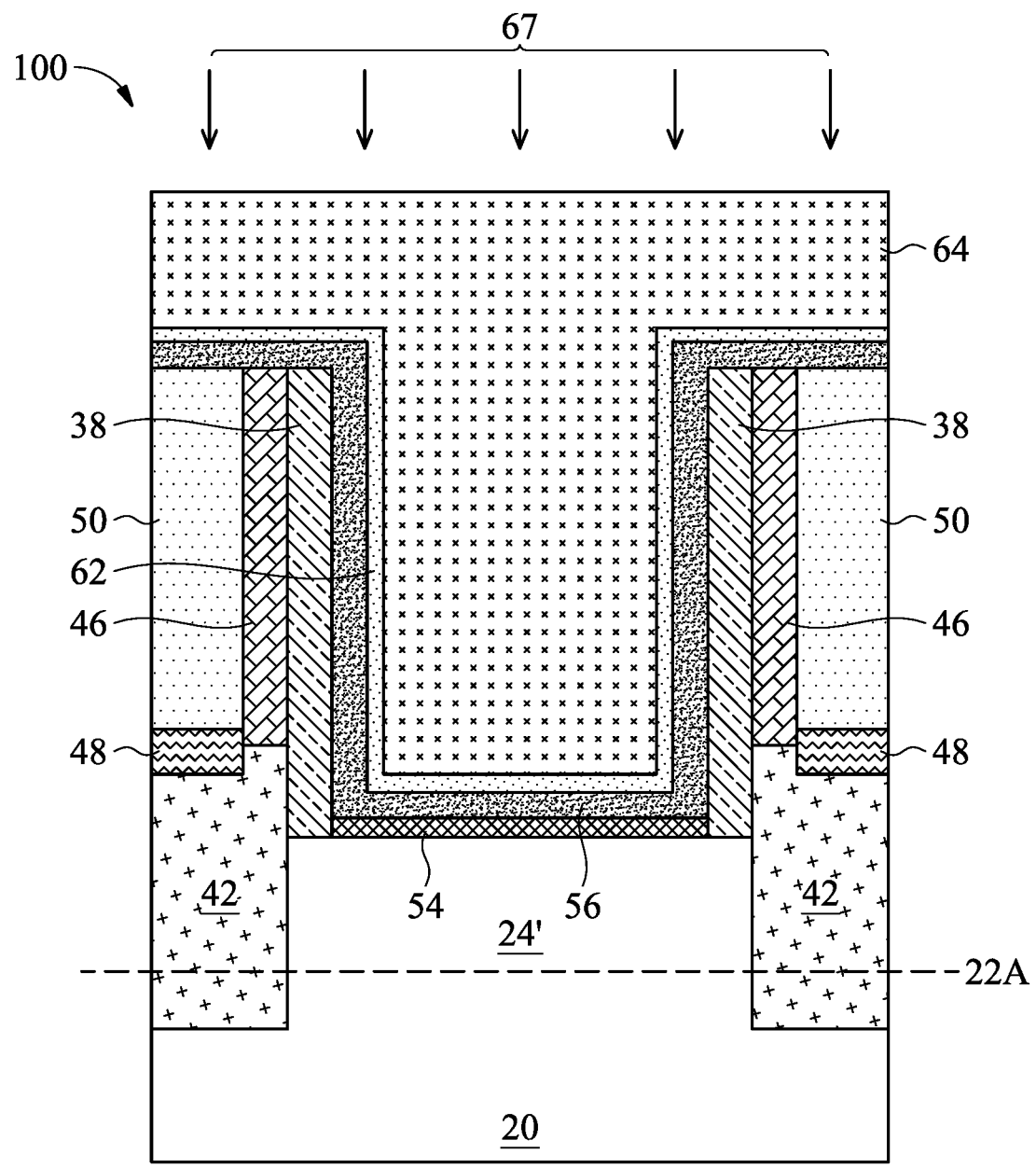

Referring to FIG. 10, capping layer 62 is formed through deposition. The deposition may be performed using a conformal deposition method such as ALD or CVD. In some embodiments, the thickness of the capping layer 62 may be between about 10 Å and about 30 Å. Capping layer 62 extends into opening 47, and some portions of capping layer 62 may extend over ILD 46. Capping layer 62 includes at least one layer, and may include a plurality of layers formed of different materials. In some cases, the specific materials of the layers in capping layer 62 may be selected according to whether the respective FinFET is an n-type FinFET or a p-type FinFET. Capping layer 62 may include one or more materials such as TiAl, TiN, TiAlN, silicon-doped TiN (TiSiN), TaN, or another material.

After the deposition of capping layer 62, sacrificial layer 64 is formed to fill the remaining portions of opening 47. In accordance with some embodiments, sacrificial layer 64 is formed of a photoresist. In some embodiments, sacrificial layer 64 is formed of another material that is different from the materials of the underlying dielectric layer 56 or capping layer 62. For example, sacrificial layer 64 may be formed of silicon oxide, silicon nitride, silicon carbide, or the like. Sacrificial layer 64 may have a substantially planar top surface, which may be caused by spin coating when sacrificial layer 64 is formed of a photo resist. In some cases, a planarization step such as a CMP process is performed.

Figure 11:
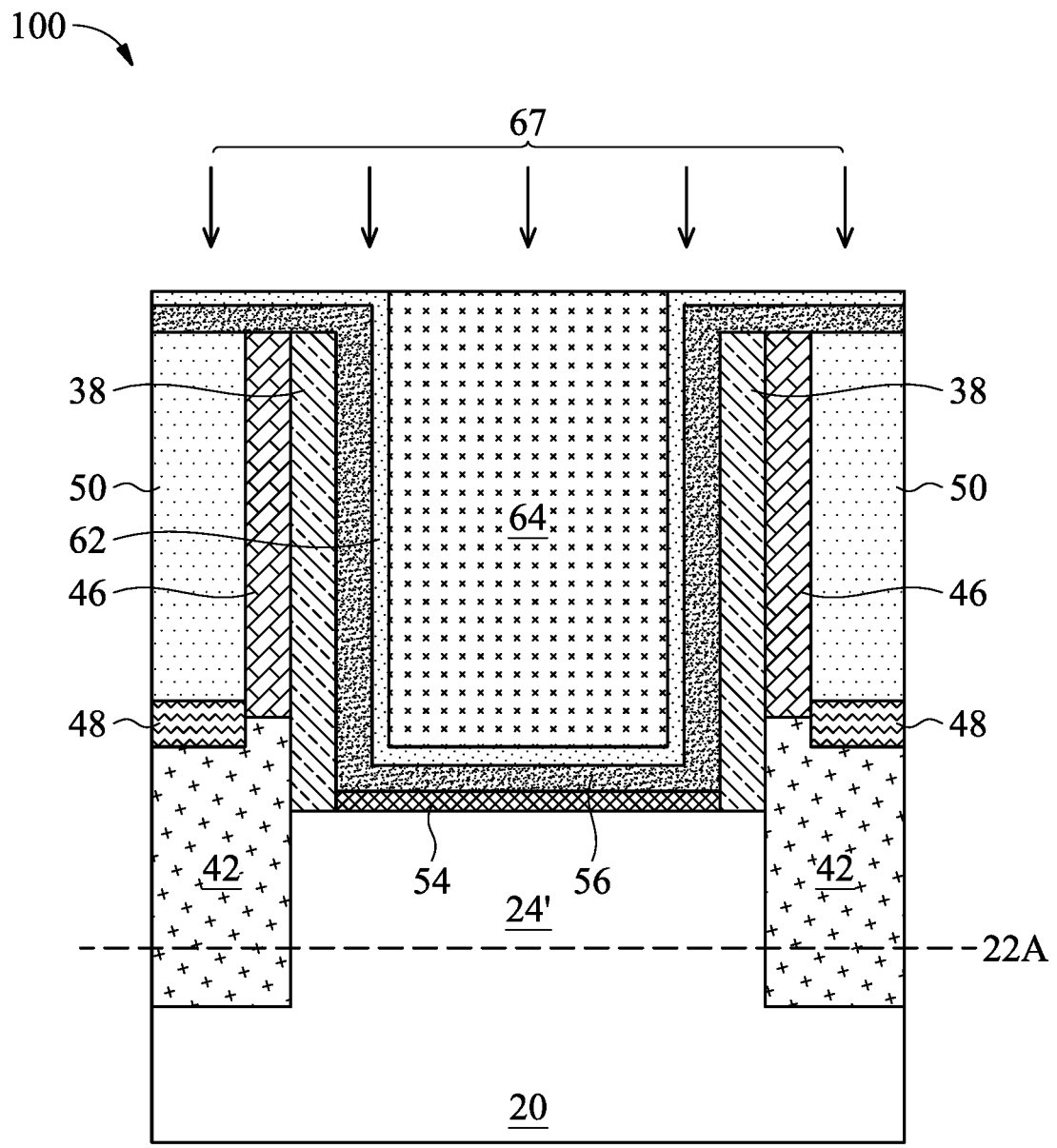

FIG. 11 illustrates the etch-back of sacrificial layer 64, which is symbolized by arrows 67. The etching may include a dry etch and/or a wet etch, and may be isotropic or anisotropic. In some embodiments, the etch-back is performed using an etchant that preferentially attacks sacrificial layer 64 and capping layer 62 over high-k dielectric layer 56. For example, the etch-back may be performed using a halogen-based dry etch.

Figure 12:
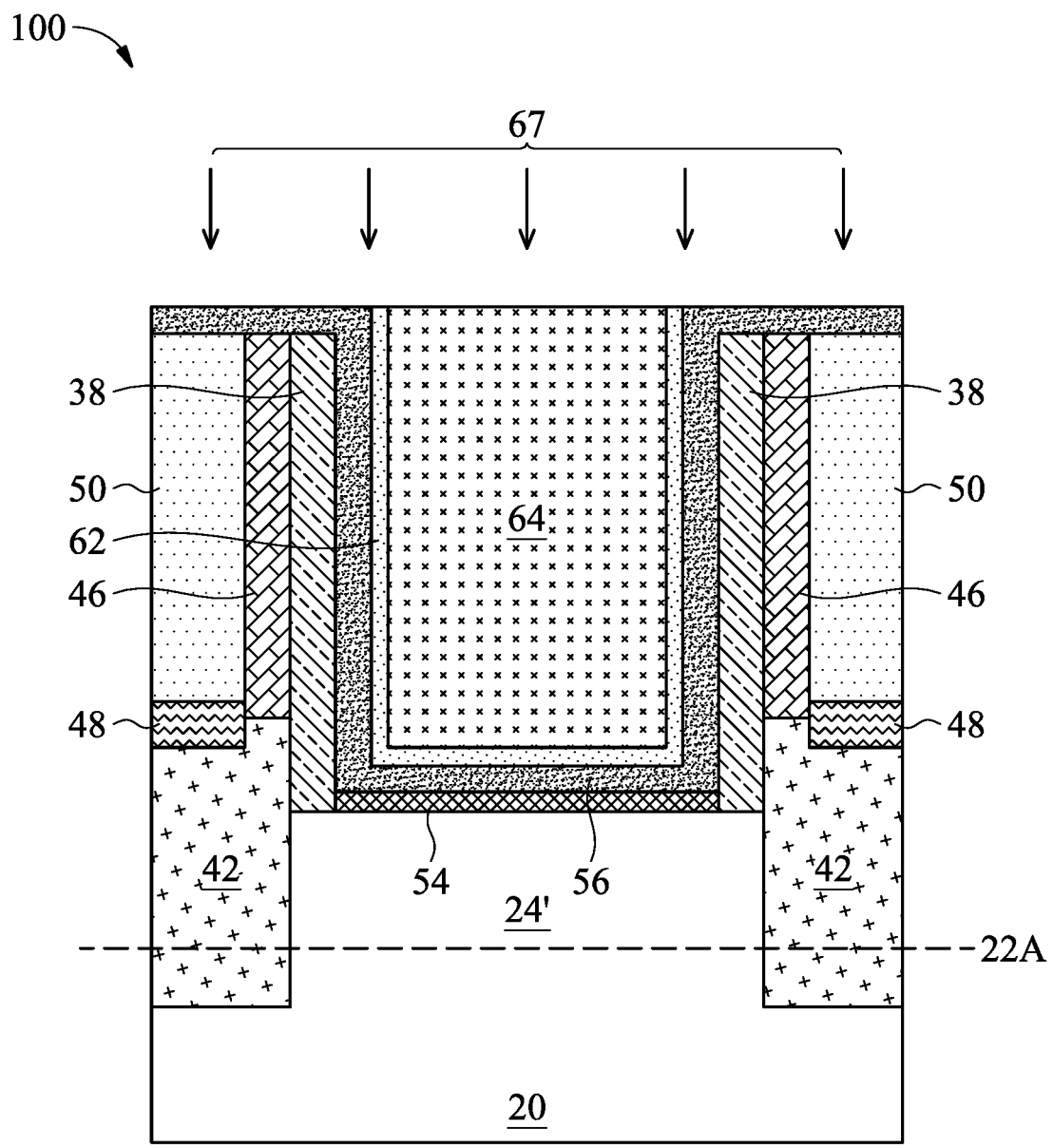

FIG. 11 illustrates an intermediate step of the etching, wherein sacrificial layer 64 is etched back, and hence capping layer 62 is exposed. Next, as shown in FIG. 12, the etch-back is continued, during which, both sacrificial layer 64 capping layer 62 are etched. As a result, high-k dielectric layer 56 is exposed. In some embodiments, high-k dielectric layer 56 is used as an etch stop layer for the etching, and exposed horizontal portions of high-k dielectric layer 56 are not etched or only slightly etched. High-k dielectric layer 56 can thus protect the underlying structure including gate spacers 38, ILD 46, and metal contact plugs 50.

Figure 13:
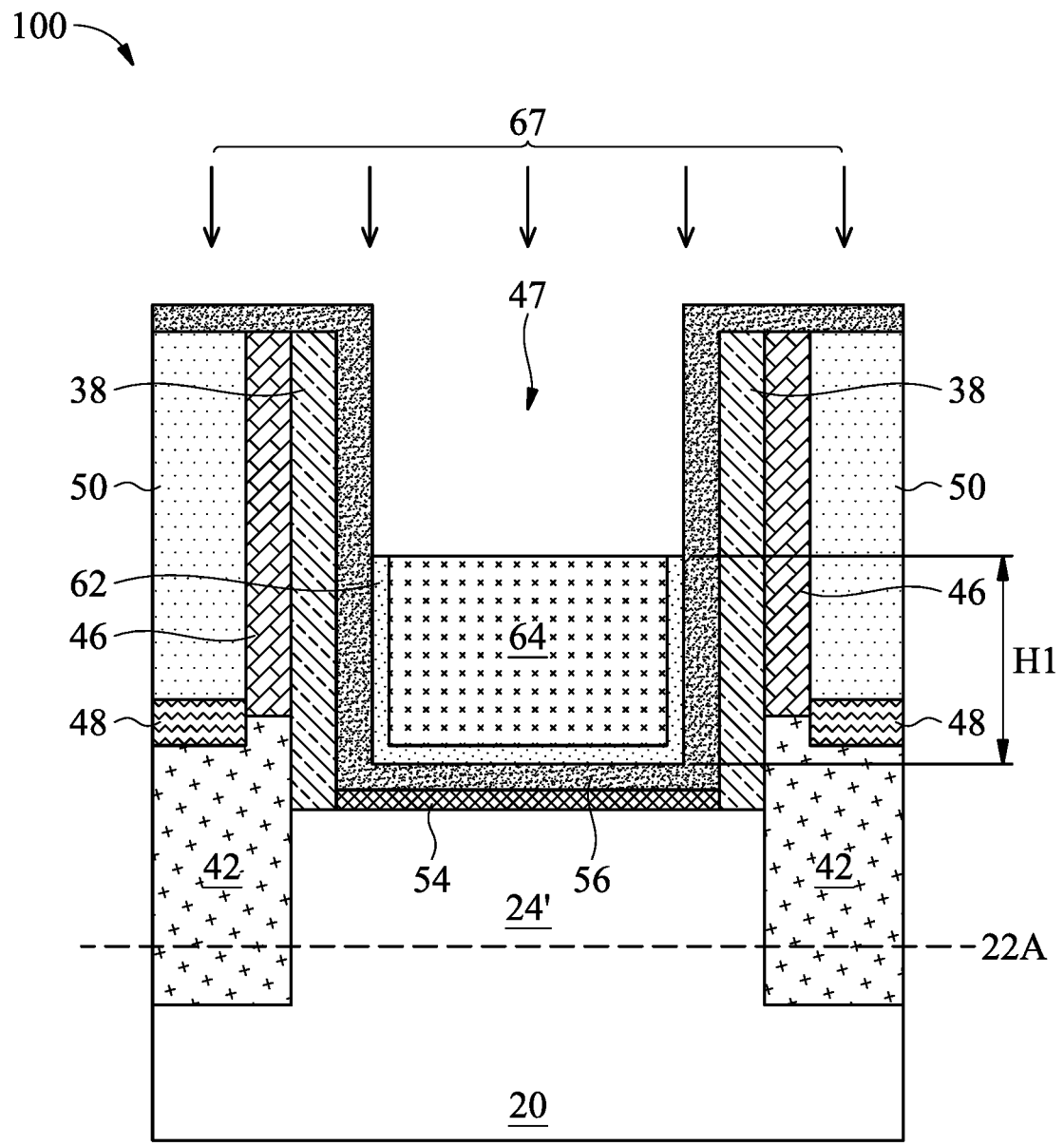

FIG. 13 illustrates a resulting structure after the etch-back is finished. Since the etchant attacks both sacrificial layer 64 and capping layer 62, during the etch-back, the top surfaces of both sacrificial layer 64 and capping layer 62 are lowered. It is appreciated that the etching rate of sacrificial layer 64 may be different from that of capping layer 62, which causes the top surface of the remaining sacrificial layer 64 to be higher than or lower than the top edges of the remaining capping layer 62. In some cases, height H1 of the remaining capping layer 62 may be in the range between about 45 Å and about 400 Å.

Figure 14:
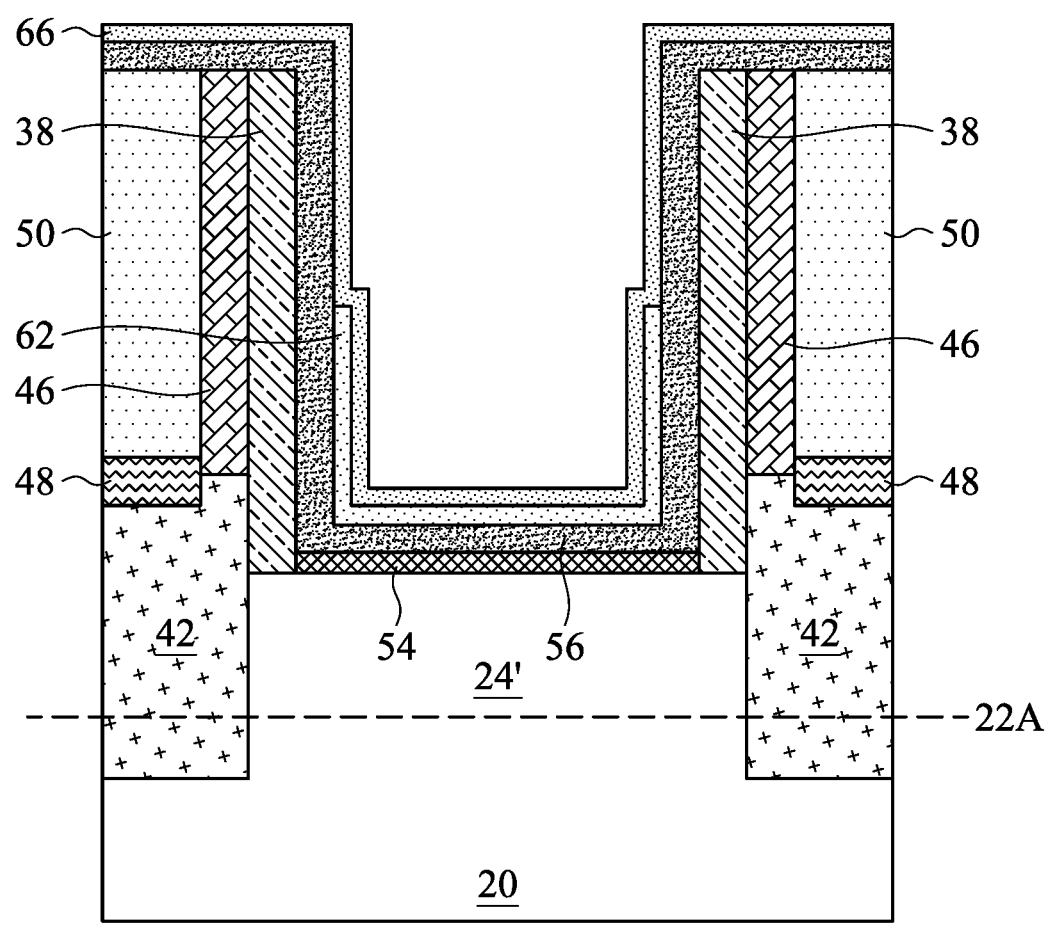

After the etch-back is finished, the remaining portion of sacrificial layer 64 is removed, for example, using a wet etch process or an ashing process, leaving remaining opening 47. Work-function layer 66 may then be formed in remaining opening 47, as shown in FIG. 14. Work-function layer 66 may be a material appropriate for the type of the respective FinFET, and its location in the metal gate can allow its work-function to affect or determine the work-function of the respective FinFET. For example, when the FinFET is an n-type FinFET, the work-function metal may have a relatively low work-function, such as lower than the mid-gap work-function (about 4.5 eV). For example, the work-function of an n-type FinFET may be between about 3.9 eV and about 4.3 eV, though other values may be used. When the FinFET is a p-type FinFET, the work-function metal may have a relatively high work-function, such as higher than the mid-gap work-function (about 4.5 eV). For example, the work-function of a p-type FinFET may be between about 4.7 eV and about 5.1 eV, though other values may be used.

In some embodiments, work-function layer 66 of a p-type FinFET may include a material such as Ti, TiN, TaN, TaSiN, $TaSi_2$, Ru, Mo, Al, $ZrSi_2$, $MoSi_2$, $NiSi_2$, WN, combinations of these, or other materials. In some embodiments, work-function layer 66 of an n-type FinFET may include a material such as Ti, TiN, TiAl, TiAlN, TaC, TaCN, TaSiN, TaN, TaAl, TaAlC, Mn, Zr, combinations of these, or other materials. In some embodiments, a p-type FinFET and an n-type FinFET may be formed on substrate 50 having a same work-function layer 66 material. In some embodiments, work-function layer 66 includes multiple layers of different materials. In some embodiments, work-function layer 66 may have a thickness between about 15 Å and about 400 Å, such as about 20 Å.

Figure 15:
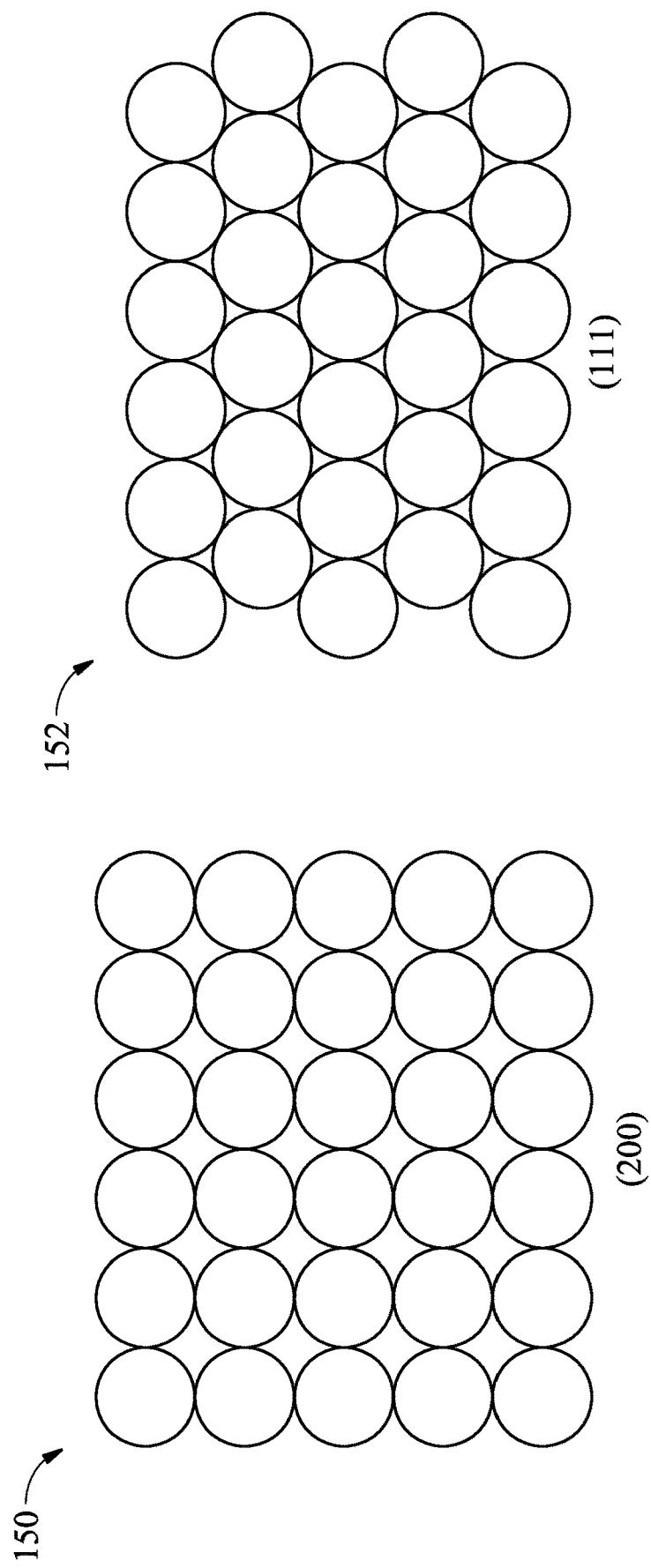

In some embodiments, work-function layer 66 may be formed having regions of a single material with different crystalline orientations. For example, the work-function layer 66 material may have at least one region with a first crystalline orientation and at least one region with a second crystalline orientation. As illustrative examples, FIG. 15 shows an illustration 150 of a crystalline plane of a material having its atoms in a (200) crystalline orientation and an illustration 152 of a crystalline plane of the same material having its atoms in a (111) crystalline orientation. In some embodiments, work-function layer 66 contains both (200) and (111) orientations, though in other embodiments, work-function layer 66 contains other orientations or more than two different orientations.

Figure 16B:
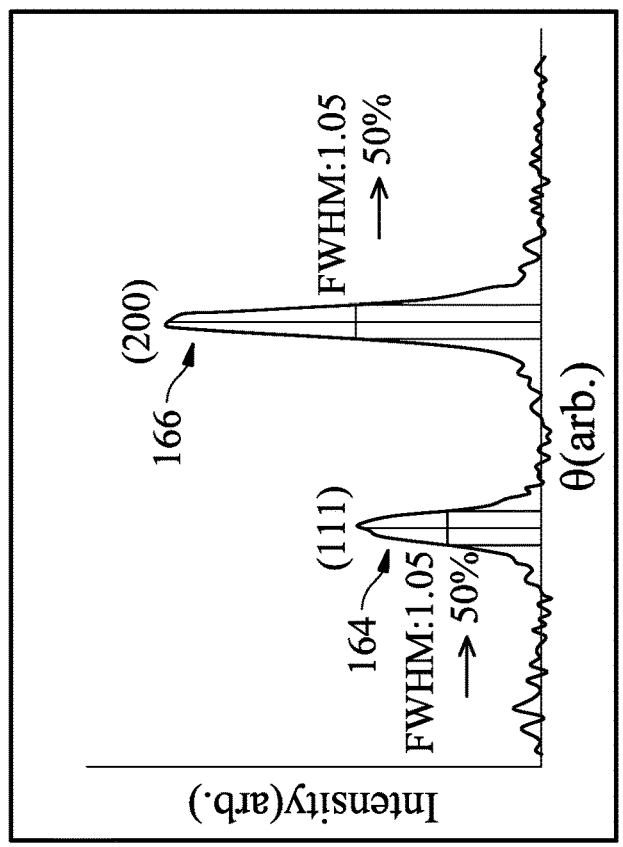
Figure 16A:
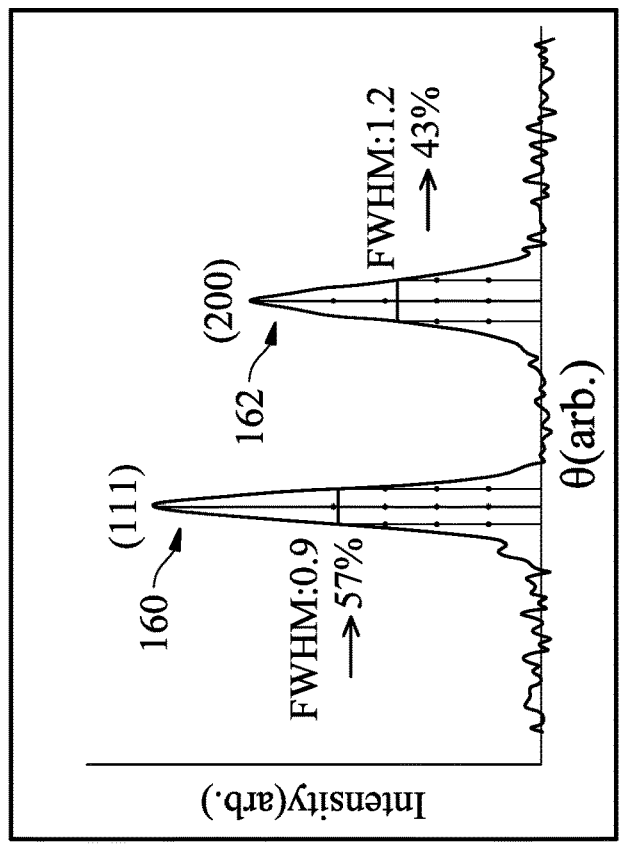

In some embodiments, the work-function layer 66 deposition process used can control the proportion of the amount of a first crystalline orientation to the amount of a second crystalline orientation present in work-function layer 66. For example, the proportion of crystalline orientations formed may be controlled by adjusting the temperature or pressure of the deposition process. As an illustrative example, FIGS. 16A-16B show x-ray diffraction measurements of two separate layers of TiN, each grown using a different deposition process. Each FIG. 16A, 16B shows peaks 160, 166 corresponding to TiN present in the (111) orientation for each TiN layer and also shows peaks 162, 168 corresponding to TiN present in the (200) orientation for each TiN layer. In particular, the relative proportion of TiN that is present in each orientation can be determined from the Full Width Half Maximum (FWHM) of each orientation's peak.

The first layer of TiN shown in FIG. 16A has a (111) peak 160 which corresponds to about 57% of the first layer of TiN being in the (111) orientation and a (200) peak 162 which corresponds to about 43% of the first layer of TiN being in the (200) orientation. Thus, FIG. 16A shows that using a first deposition process, a TiN layer may be formed having more of the TiN in the (111) orientation than in the (200) orientation. Similarly, for the second layer of TiN, FIG. 16B shows a (111) orientation peak 164 corresponding to about 50% and a (200) orientation peak 166 corresponding to about 50%. Thus, FIG. 16B shows that using a second deposition process, a TiN layer may be formed having approximately equal amounts of the TiN in the (111) orientation and in the (200) orientation.

FIGS. 16A-16B show that different proportions of particular crystalline orientations may be formed by using different process parameters. For example, the TiN layer shown in FIG. 16A was formed at a higher temperature than the TiN layer formed in FIG. 16B. In this manner, by using a certain processes, a layer may be formed having a desired proportion of crystalline orientations. For example, the TiN may be formed at one or more temperatures between about 300° C. and about 400° C., for which TiN formed at higher temperatures has a greater proportion of the TiN in the (111) crystalline orientation than in the (200) orientation. In other embodiments, temperatures below 300° C. or above 400° C. may be used for forming one or more layers of TiN or of other materials. In some embodiments, other materials or combinations of materials may be formed having different proportions of different crystalline orientations. Other process differences may be also used to produce different proportions of crystalline orientations, such as differences in pressures or other differences in temperatures. Work-function layer 66 may be formed using Physical Vapor Deposition, ALD, CVD, or the like. In some embodiments, work-function layer 66 may be formed using $TiCl_4$ or $NH_3$ as precursors, but other precursors may also be used.

In some cases, different crystalline orientations of a material may have different work-functions. For example, in the case of TiN, the (111) orientation of TiN has a work-function of about 4.4 eV and the (200) orientation of TiN as a work-function of about 4.6 eV. Thus, the work-function of work-function layer 66 may be adjusted by controlling the proportions of various crystalline orientations present in work-function layer 66 to make work-function layer 66 more suitable for use in an n-type FinFET or a p-type FinFET. For example, in the case of a TiN work-function layer 66, the work-function of work-function layer 66 may have an overall average work-function between about 4.4 eV and about 4.6 eV by forming the TiN with a specific corresponding proportion of crystalline orientations. For example, for a TiN layer being half (111) orientation (having a work-function of about 4.4 eV) and half (200) orientation (having a work-function of about 4.6 eV), the TiN layer would have an overall average work-function of about 4.5 eV. The crystalline orientations in work-function layer 66 may be controlled, for example, using some or all of the techniques described above. In other embodiments, other materials or combinations of materials may be used, and the materials may have different orientations with different work-functions. In this manner, the threshold voltage of a FinFET may be adjusted by controlling the deposition process of work-function layer 66 to control the proportion of its crystalline orientations.

In some cases, certain crystalline orientations of a material are more likely to block the diffusion of an impurity, and certain crystalline orientations of the material are more likely to allow the diffusion of an impurity or the incorporation of an impurity as a dopant. In some cases, the concentration of a dopant present in work-function layer 66 may change the work-function of work-function layer 66. By controlling the deposition process of work-function layer 66 as described above, the proportion of crystalline orientations that each have different dopant diffusibilities can be controlled, and thus the amount of the dopant that diffuses into work-function layer 66 can be controlled. In this manner, the work-function of work-function layer 66 may be adjusted by controlling the amount of dopant that incorporates into work-function layer 66. For example, in the case of TiN, some halogen impurities such as fluorine (F) are more likely to diffuse into TiN having a (111) crystalline orientation than into TiN having a (200) crystalline orientation.

In addition, certain crystalline orientations may be more likely to incorporate a certain impurity as a dopant than other crystalline orientations. For example, in the case of TiN, the (111) orientation is more likely to incorporate fluorine as a dopant than the (200) orientation. In some embodiments, one or more impurities that are present during subsequent processing steps can diffuse into work-function layer 66 as dopants. For example, impurities present during or after subsequent etch processes or deposition processes may diffuse into work-function layer 66 and change the work-function of work-function layer 66. In this manner, impurities which are already present during device processing may be used to control the work-function of work-function layer 66, and thus control the threshold voltage of the FinFET. The Work-function of work-function layer 66 may also thus be controlled for suitability in an n-type FinFET or a p-type FinFET. In some cases, no additional implantation process is needed to adjust the work-function by doping. In some embodiments, dopants may be introduced into work-function layer 66 using other techniques, such as implantation, thermal diffusion, chemical reaction, introduction during the deposition of work-function layer 66, or another technique. In some embodiments, an anneal or other thermal process may be used to facilitate the diffusion of dopants into work-function layer 66.

As an illustrative example, in the case of a TiN work-function layer 66, fluorine present in subsequent processing steps may diffuse into the TiN, with the fluorine more likely to diffuse into regions of the TiN work-function layer 66 having the (111) orientation. Thus, in this example, the overall concentration of fluorine present in a TiN work-function layer 66 may be controlled by forming the TiN work-function layer 66 to have a greater proportion of the (111) orientation. In some cases, the incorporation of F into a TiN work-function layer 66 can decrease the work-function by up to about 50%. This is an example, and in other embodiments work-function layer 66 may have other materials, impurities, or crystalline orientations.

In some embodiments, forming work-function layer 66 to have a smaller thickness can allow a greater concentration of dopants to diffuse into work-function layer 66. For example, work-function layer 66 may be formed having a thickness less than about 20 Å, such as about 16 Å. In some embodiments, the concentration of dopant present in work-function layer 66 may be greater than about 3%, though the concentration may be less than or equal to about 3% in other embodiments. In this manner, the threshold voltage of a FinFET may be adjusted by incorporating dopants within work-function layer 66, and the concentration of dopants may be controlled by controlling the work-function layer deposition process to achieve a particular thickness of work-function layer 66 or a particular proportion of crystalline orientations of work-function layer 66. In some embodiments, control of work-function layer 66 as described may be used for both n-type FinFET devices or p-type FinFET devices.

In some embodiments, a thermal process may be performed after a layer's formation that recrystallizes the layer into having a desired proportion of crystalline orientations. In this manner, work-function layer 66 may be recrystallized after deposition to achieve a desired proportion of crystalline orientations. For example, after growing an initial TiN layer with a relatively low proportion of (111) orientation, the layer may be heated to a temperature so that the initial TiN layer recrystallizes into a TiN layer having a relatively high proportion of TiN in the (111) orientation. In some embodiments, a TiN layer may be recrystallized one or more times during subsequent processing steps via heating, which may be performed at one or more temperatures. In this manner, the properties of a TiN layer may be controlled throughout the manufacturing process. Other materials or other crystalline orientations may be used. The thermal process may be any suitable thermal process, such as rapid thermal processing (RTP) anneal, spike anneal, laser anneal, or other thermal techniques.

Figure 17:
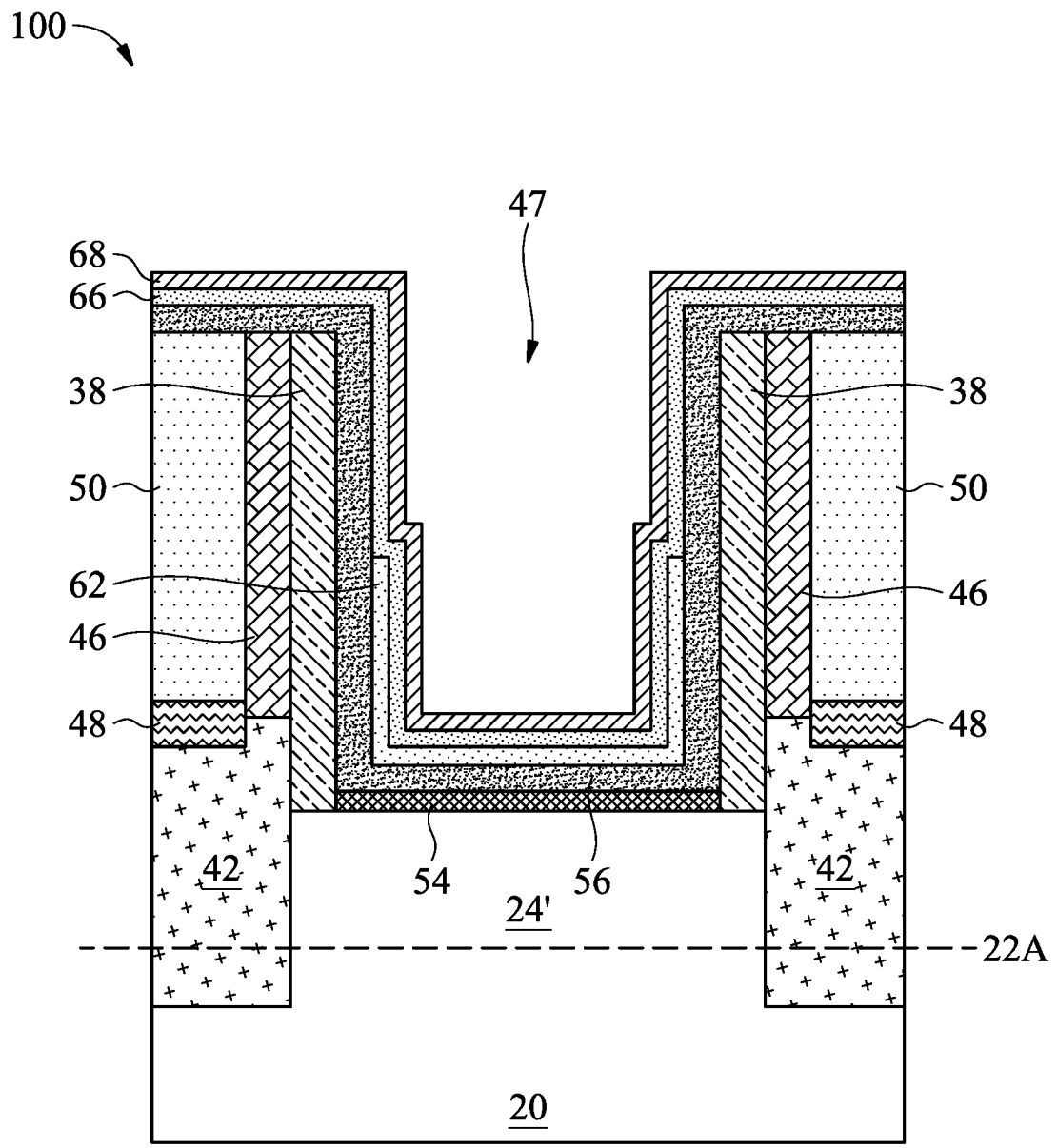

Barrier layer 68 may then be formed over work-function layer 66, as shown in FIG. 17. Barrier layer 68 may be a material such as Ti, TiAl, TiN TiAlN, TaAlN, TaN, combinations of these, or another material. In some embodiments, barrier layer 68 includes multiple layers of different materials. Barrier layer 68 may be formed using Physical Vapor Deposition, ALD, CVD, or the like.

Figure 18:
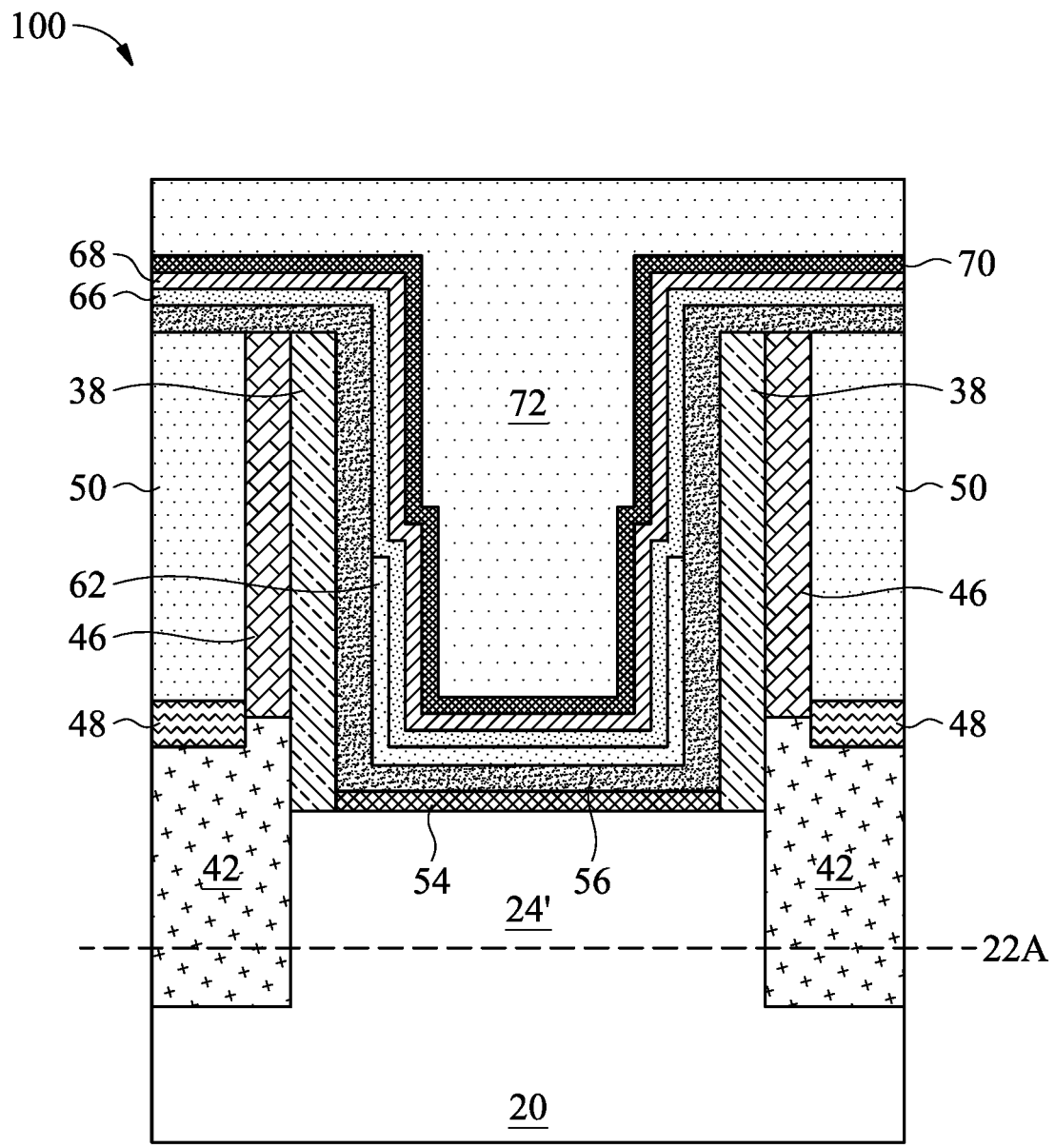

Next, seed layer 70 and bulk metal 72 may be formed over barrier layer 68, as shown in FIG. 18. Seed layer 70 can provide an improved interface between barrier layer 68 and a subsequently deposited conductive material, such as bulk metal 72. After deposition of seed layer 70, bulk metal 72 is deposited to fill the opening 47. Seed layer 70 or the bulk metal 72 may be W, Cu, Al, or another conductive material or combination of materials. In some embodiments, bulk metal 72 may be formed using CVD, ALD, or another method.

Figure 19:
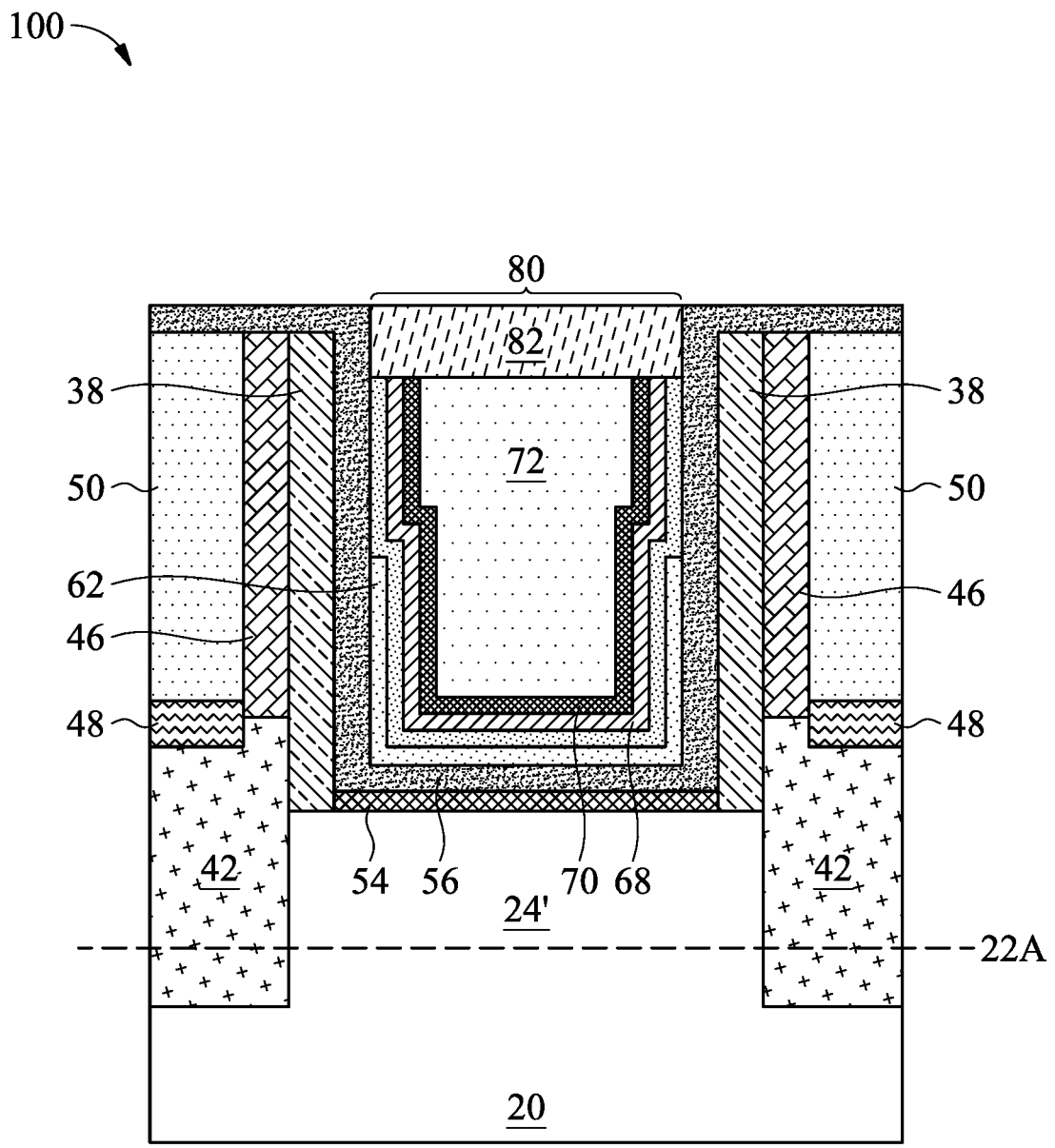

Next, a planarization process (for example, a CMP) is performed to remove portions of high-k dielectric layer 56, work-function layer 66, barrier layer 68, seed layer 70, and bulk metal 76. Horizontal portions of high-k dielectric layer 56 over ILD 46 are also removed. The remaining portions of layers 56, 62, 66, 68, 70, and 76 in combination form replacement gate stack 80. Each of the remaining portions of layers 56, 62, 66, 68, 70, and 76 includes a bottom portion and sidewall portions over and connected to the bottom portion. Next, as shown in FIG. 19, layers 66, 68, 70, and 76 are recessed, and the corresponding recess is filled with hard mask 82, which is a dielectric hard mask formed of silicon nitride, silicon oxynitride, silicon oxy-carbide, or the like. Layers 66, 68, 70, and 76 may be recessed by using one or more wet or dry etching processes, for example. Hard mask 82 is also planarized so that its top surface is coplanar with the top surface of ILD 46.

In the illustrated embodiments, source/drain contact plugs 50 are formed before the formation of replacement gate stack 80. In some embodiments of the present disclosure, source/drain contact plugs 50 are formed after the formation of replacement gate stack 80.

Figure 20:
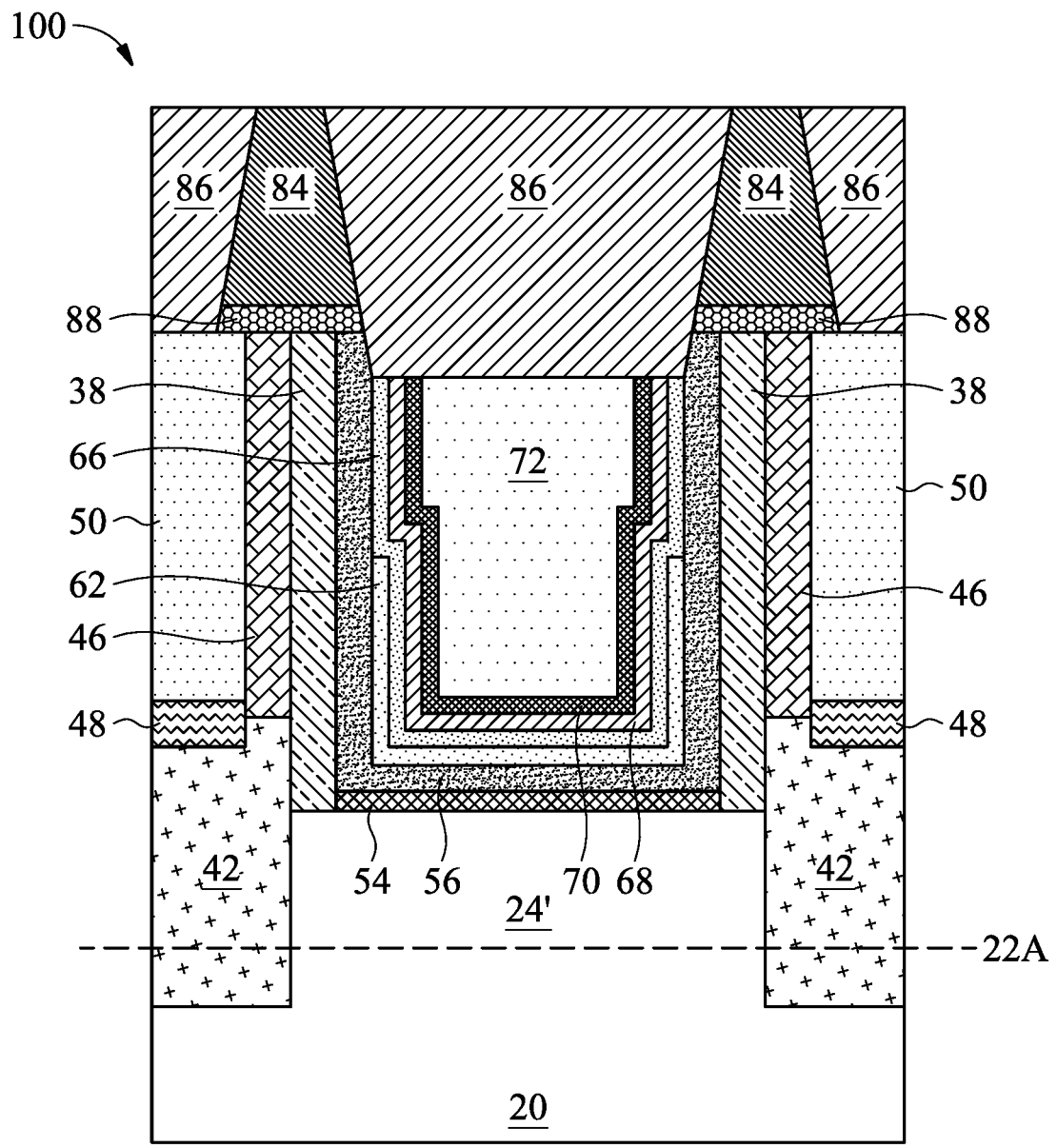

Referring to FIG. 20, etch stop layer 88 is formed over replacement gate stack 80. Etch stop layer 88 is formed of a dielectric material, which may include silicon carbide, silicon nitride, silicon oxynitride, or the like. ILD 84 is formed over Etch stop layer 88, and contact plugs 86 are formed in ILD 84. The formation process may include forming contact plug openings in ILD 84 to expose replacement gate stack 80 and source/drain contact plugs 50, and filling the contact plug openings with a conductive material to form contact plugs 86. In the illustrated plane, hard mask 82 (FIG. 19) is also removed, so that gate contact plug 86 extends into the recess left by the removed hard mask 82.

Figure 21:
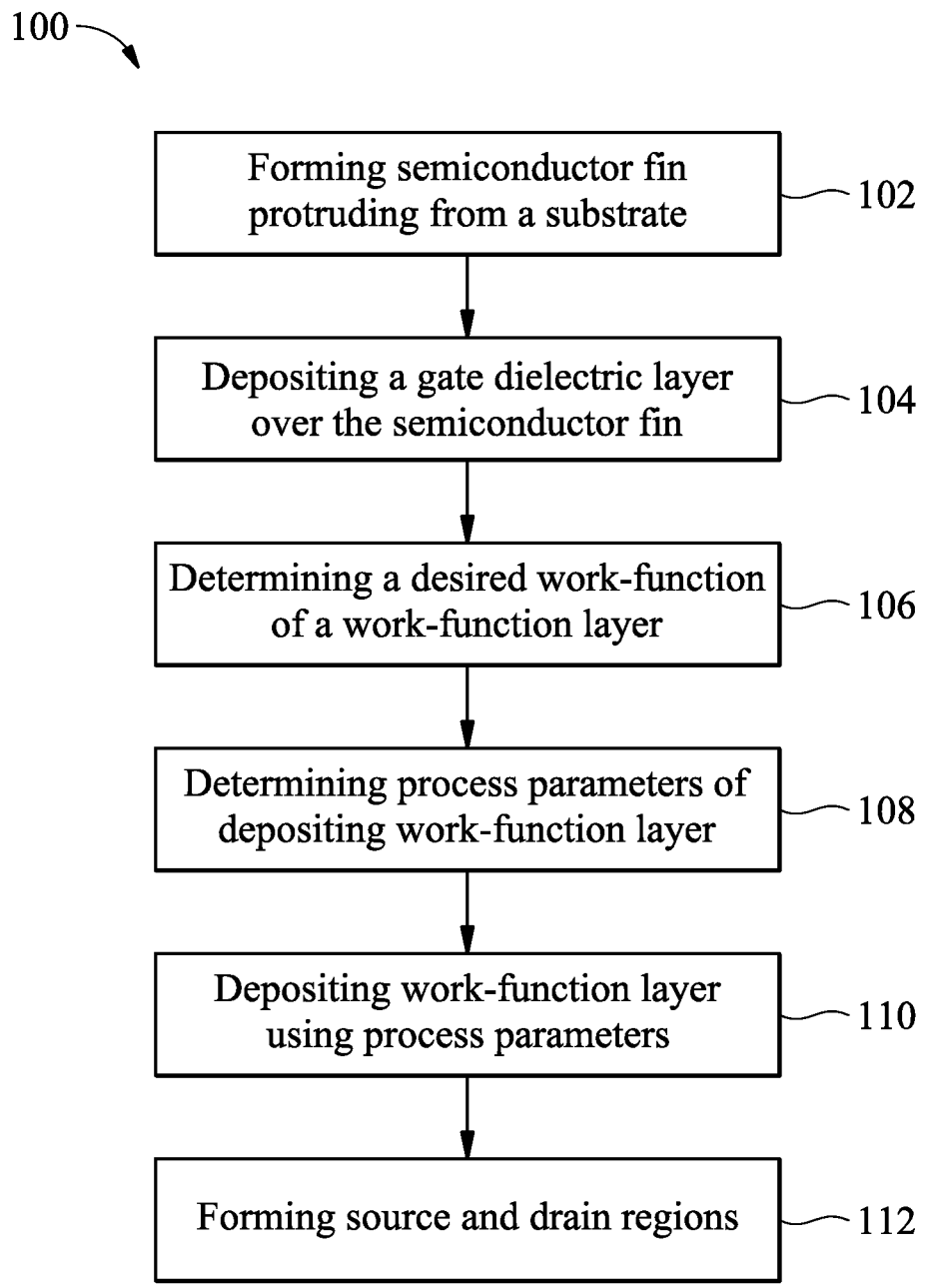
FIG. 21 illustrates a flow chart of a method of manufacturing a semiconductor device, in accordance with some embodiments.

FIG. 21 illustrates a flowchart of a method 100 for forming a semiconductor device, in accordance with various embodiments of the present disclosure. The flowchart shown in FIG. 21 is merely an example, which should not unduly limit the scope of the claims. One of ordinary skill in the art would recognize many variations, alternatives, and modifications. For example, various steps as illustrated in FIG. 21 may be added, removed, replaced, rearranged and repeated.

Referring to FIG. 21, at step 102, a semiconductor fin is formed protruding above a substrate. This is shown, for example, in FIG. 1. At step 104, a gate dielectric is deposited over the semiconductor fin. This is shown, for example, in FIG. 9. The gate dielectric is part of a gate stack formed over the semiconductor fin. At step 106, a desired work-function of a work-function layer is determined. The desired work-function may depend on factors such as the desired threshold voltage of the final semiconductor device, whether the semiconductor device is an n-type or a p-type device, or other factors. At step 108, process parameters of the deposition of the work-function layer are determined. The process parameters may include deposition temperature, pressure, precursor material, deposition thickness, deposition time, or other parameters. The process parameters may also be determined so as to form a work-function layer having a particular proportion of crystalline orientations. At step 110, the work-function layer is deposited using the determined process parameters. This is shown, for example, in FIG. 14. The work-function layer is part of the gate stack. At step 112, source and drain regions are formed. The source and drain regions may be formed adjacent the gate stack that includes the gate dielectric and the work-function layer. In some embodiments, the source and drain regions are formed prior to forming the gate stack. This is shown, for example, in FIG. 5.

Figure 22:
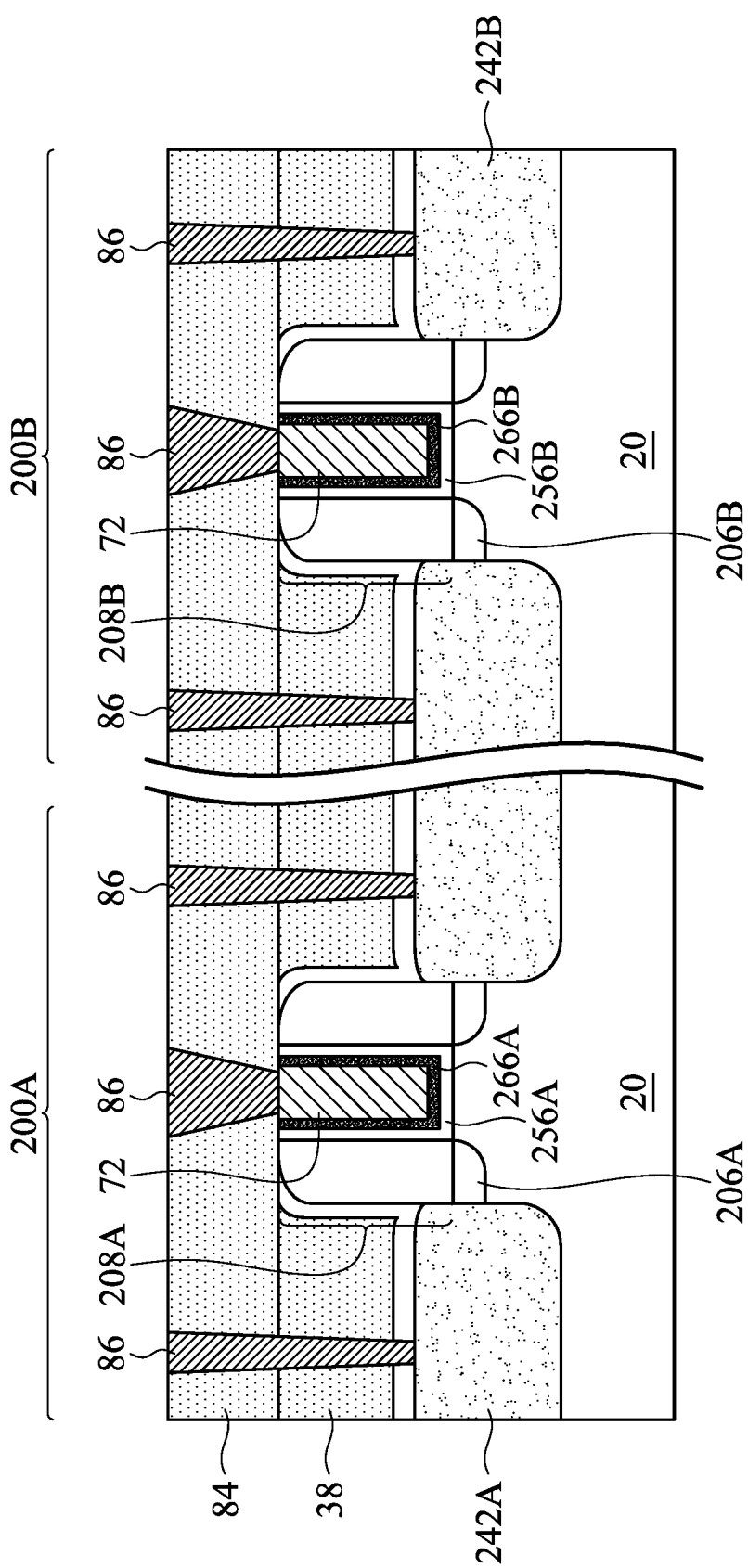
FIG. 22 illustrates a cross-sectional view of Fin Field-Effect Transistors (FinFETs) in accordance with some embodiments.

FIG. 22 illustrates an n-type FinFET 200A and a p-type FinFET 200B, in accordance with various embodiments of the present disclosure. N-type FinFET 200A and p-type FinFET 200B may be formed in a process similar to that described with respect to FIGS. 1-21, and like reference numbers of FIG. 22 are used to designate like elements of FIGS. 1-20. In other embodiments, n-type FinFET 200A and p-type FinFET 200B may be formed using one or more different processes or steps without limiting the scope of this disclosure.

N-type FinFET 200A and p-type FinFET 200B shown in FIG. 22 are formed on a single substrate 20. N-type FinFET 200A and p-type FinFET 200B include epitaxy regions 242A and epitaxy regions 242B, respectively, which may be similar to epitaxy regions 42 as described previously. N-type FinFET 200A and p-type FinFET 200B also include lightly doped source/drain (LDD) regions 206A and 206B, respectively. As shown in FIG. 22, n-type FinFET 200A includes gate stack 208A, which includes gate dielectric 256A and n-type work-function layer 266A formed over gate dielectric 256A. P-type FinFET 200B includes gate stack 208B, which includes gate dielectric 256B and p-type work-function layer 266B formed over gate dielectric 256B. The gate dielectric 256A or gate dielectric 256B may be similar to gate dielectric 58 as described previously. N-type work-function layer 266A and p-type work-function layer 266B may be similar to work-function layer 66 described previously. In some embodiments, n-type work-function layer 266A and p-type work-function layer are formed from the same work-function material. For example, in some embodiments, n-type work-function layer 266A and p-type work-function layer 266B both include TiN, though in some embodiments they may both be one or more other materials.

In some embodiments, n-type work-function layer 266A and p-type work-function layer 266B are formed using the same work-function material or materials, but with different process parameters. The process parameters can be chosen so as to produce a more suitable work-function of n-type work function layer 266A or a more suitable work-function of p-type work-function layer 266B. For example, n-type work-function layer 266A may be formed by depositing a work-function material using a first set of process parameters to have a first proportion of crystalline orientations, and p-type work-function layer 266B may be formed by depositing the same work-function material using a second set of process parameters to have a second proportion of the same crystalline orientations. A work-function material having different crystalline orientations can have a different work-function or a different dopant diffusibility, which can affect changes to the work-function material's work-function via doping. Different process parameters that may form different proportions of crystalline orientations suitable for n-type or p-type devices are described above.

In some embodiments, N-type work-function layer 266A or p-type work-function layer 266B may be deposited in separate deposition steps. For example, a mask layer (e.g., photoresist, hardmask, etc.) may be formed over the region of p-type FinFET 200B using known photolithographic techniques, leaving the region of n-type FinFET 200A exposed. The n-type work-function layer 266A may then be deposited using first process parameters. The mask layer over the region of p-type FinFET 200B may then be removed and a mask layer formed over the region of n-type FinFET 200A. P-type work-function layer 266B may then be deposited using second process parameters. In this manner, n-type work-function layer 266A and p-type work-function layer 266B may be the same material but, due to the different process conditions, have different work-functions suitable for each type of transistor. In some cases, n-type work-function layer 266A or p-type work-function layer 266B be deposited simultaneously using the same process parameters.

In some embodiments, n-type work-function layer 266A or p-type work-function layer 266B are doped during or after deposition. For example, one or both of n-type work-function layer 266A or p-type work-function layer 266B may be doped using fluorine or another material, described above. In some cases, the dopant types or dopant concentrations introduced into each of n-type work-function layer 266A or p-type work-function layer 266B may be different. The different doping characteristics may be due to doping each of n-type work-function layer 266A or p-type work-function layer 266B in separate steps. Different doping characteristics also may be due to differences in dopants introduced into n-type work-function layer 266A or p-type work-function layer 266B during subsequent processing steps. In this manner, the different doping characteristics of n-type work-function layer 266A or p-type work-function layer 266B may control the work-function to be a more suitable work-function, even if the work-function material is deposited using the same process parameters. Differences in doping may also be used for controlling the work-function suitability of n-type work-function layer 266A or p-type work-function layer 266B that are deposited in separate process steps.

The embodiments of the present disclosure have some advantageous features. For example, properties of one or more work-function layers can be controlled to adjust the threshold voltage of a FinFET. The properties may also be controlled to adjust the work-function suitability of the work-function layer of an n-type device or the work-function layer of a p-type device that are formed on the same substrate. The properties may also be controlled to adjust the work-functions of the work-function layers of two or more of the same type of device formed on the same substrate. These properties include the doping concentration, the thickness, and the proportion of different crystalline orientations of the work-function material. The techniques described herein allow the threshold voltage to be adjusted by adjusting several different properties of the work-function layer, which can allow greater process control and greater process flexibility. Work-function layers and embodiments as disclosed herein may be used in transistors other than FinFETs, such as planar MOSFETs or other types of transistors.

In accordance with some embodiments of the present disclosure, a method includes forming an n-type transistor. The method includes forming a first semiconductor fin protruding from a substrate and forming a first gate stack over the first semiconductor fin. Forming the first gate stack includes depositing a first gate dielectric layer over the first semiconductor fin, and depositing a work-function material using a first set of process parameters, wherein the first set of process parameters is associated with forming the work-function material having a first work-function, wherein the first work-function is associated with a first proportion of a first crystalline orientation and a second crystalline orientation of the work-function material. The method also includes forming a p-type transistor, which includes forming a second semiconductor fin protruding from the substrate, and forming a second gate stack over the second semiconductor fin, wherein forming the second gate stack includes depositing a second gate dielectric layer over the second semiconductor fin and depositing a work-function material using a second set of process parameters, wherein the second set of process parameters is associated with forming the work-function material having a second work-function, wherein the second work-function is associated with a second proportion of a first crystalline orientation and a second crystalline orientation of the work-function material. In an embodiment, the method further includes diffusing a dopant into the work-function material. In an embodiment, the dopant is fluorine. In an embodiment, the first crystalline orientation has a first diffusibility of the dopant and the second crystalline orientation has a second diffusibility of the dopant that is different from the first diffusibility. an embodiment, the work-function material is TiN. an embodiment, the work-function material is deposited to a thickness less than about 20 Å. In an embodiment, the first crystalline orientation is (111) and the second crystalline orientation is (200). In an embodiment, the first proportion is a ratio between the amount of the first crystalline orientation present in the work-function material of the n-type transistor and the amount of the second crystalline orientation present in the work-function material of the n-type transistor.

In accordance with some embodiments of the present disclosure, a method includes forming a first transistor, which includes forming a first gate dielectric layer over a first channel region in a substrate and forming a first work-function layer over the first gate dielectric layer, wherein forming the first work-function layer includes depositing a work-function material using first process conditions to form the work-function material having a first proportion of different crystalline orientations and forming a second transistor, which includes forming a second gate dielectric layer over a second channel region in the substrate and forming a second work-function layer over the second gate dielectric layer, wherein forming the second work-function layer includes depositing the work-function material using second process conditions to form the work-function material having a second proportion of different crystalline orientations. In an embodiment, the method further includes diffusing a dopant into the work-function layer, wherein the dopant diffuses into regions of the work-function layer having a first crystalline orientation more than the dopant diffuses into regions of the work-function material having a second crystalline orientation. In an embodiment, the dopant is fluorine. In an embodiment, the first process conditions include a first temperature, wherein the first temperature is between about 300° C. and about 400° C. In an embodiment, the method further includes annealing the work-function layer. In an embodiment, the first transistor is n-type and the second transistor is p-type.

In accordance with some embodiments of the present disclosure, a semiconductor device includes an n-type transistor and a p-type transistor. The n-type transistor includes a first fin extending from a substrate, a first gate dielectric layer over the first fin, and a first work-function layer over the first gate dielectric layer. The a p-type transistor includes a second fin extending from the substrate, a second gate dielectric layer over the second fin, and a second work-function layer over the second gate dielectric layer, wherein the first work-function layer and the second work-function layer include the same work-function material, and wherein the first work-function layer has a first proportion of crystalline orientations and the second work-function layer has a second proportion of crystalline orientations. In an embodiment, the work-function material includes TiN. In an embodiment, the work-function material includes a dopant, wherein the dopant has a greater concentration in first regions of the work-function material having a first crystalline orientation than in second regions of the work-function material having a second crystalline orientation. In an embodiment, the dopant is fluorine. In an embodiment, the first crystalline orientation is (111) and the second crystalline orientation is (200). In an embodiment, the first work-function layer has a thickness of less than about 20 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an n-type transistor comprising:
      forming a first semiconductor fin protruding from a substrate;
      forming a first dummy gate over the first semiconductor fin;
      forming first gate spacers on sidewalls of the first dummy gate;
      removing the first dummy gate and forming a first gate stack over the first semiconductor fin to replace the first dummy gate, wherein forming the first gate stack comprises:
         depositing a first gate dielectric layer over the first semiconductor fin;
         forming a capping layer material over the first gate dielectric layer; and
         after forming the capping layer material, depositing a work-function material over the capping layer material using a first set of process parameters, wherein the first set of process parameters is associated with forming the work-function material having a first work-function, wherein the first work-function is associated with a first proportion of a first crystalline orientation and a second crystalline orientation of the work-function material; and
   forming a p-type transistor comprising:
      forming a second semiconductor fin protruding from the substrate;
      forming a second dummy gate over the second semiconductor fin;
      forming second gate spacers on sidewalls of the second dummy gate;
      removing the first second dummy gate and forming a second gate stack over the second semiconductor fin to replace the second dummy gate, wherein forming the second gate stack comprises:
         depositing a second gate dielectric layer over the second semiconductor fin;
         forming the capping layer material over the second gate dielectric layer; and
         after forming the capping layer material, depositing the work-function material over the capping layer material using a second set of process parameters, wherein the second set of process parameters is associated with forming the work-function material having a second work-function, wherein the second work-function is associated with a second proportion of the first crystalline orientation and the second crystalline orientation of the work-function material.

2. The method of claim 1, further comprising diffusing a dopant into the work-function material.

3. The method of claim 2, wherein the dopant is fluorine.

4. The method of claim 2, wherein the first crystalline orientation has a first diffusibility of the dopant and the second crystalline orientation has a second diffusibility of the dopant that is different from the first diffusibility.

5. The method of claim 1, wherein the work-function material is TiN.

6. The method of claim 1, wherein the work-function material is deposited to a thickness less than about 20 Å.

7. The method of claim 1, wherein the first crystalline orientation is (111) and the second crystalline orientation is (200).

8. The method of claim 1, wherein the first proportion is a ratio between the amount of the first crystalline orientation present in the work-function material of the n-type transistor and the amount of the second crystalline orientation present in the work-function material of the n-type transistor.

9. A method comprising:
   forming a first transistor, comprising:
      forming a first fin in a substrate comprising a first channel region;
      forming a first gate dielectric layer over the first channel region;
      forming a first work-function layer over the first gate dielectric layer, wherein forming the first work-function layer comprises conformally depositing a work-function material using first process conditions to form the work-function material having a first proportion of different crystalline orientations; and
      depositing a bulk metal over the first work-function layer; and
   forming a second transistor, comprising:
      forming a second fin in the substrate comprising a second channel region;
      forming a second gate dielectric layer over the second channel region;
      forming a second work-function layer over the second gate dielectric layer, wherein forming the second work-function layer comprises conformally depositing the work-function material using second process conditions to form the work-function material having a second proportion of different crystalline orientations; and
      depositing the bulk metal over the second work-function layer.

10. The method of claim 9, further comprising diffusing a dopant into the work-function material, wherein the dopant diffuses into regions of the work-function material having a first crystalline orientation more than the dopant diffuses into regions of the work-function material having a second crystalline orientation.

11. The method of claim 10, wherein the dopant is fluorine.

12. The method of claim 9, wherein the first process conditions comprise a first temperature, wherein the first temperature is between about 320° C. and about 380° C.

13. The method of claim 9, further comprising annealing the work-function material.

14. The method of claim 9, wherein the first transistor is n-type and the second transistor is p-type.

15. A method comprising:
   forming an n-type transistor, comprising:
      forming a first fin extending from a semiconductor substrate;
      forming a first gate dielectric layer on the first fin;
      forming a first capping layer on the first gate dielectric layer;
      forming a first work-function layer on the first capping layer, wherein the first work-function layer extends conformally over the first capping layer; and
      forming a bulk metal on the first work-function layer, and
   forming a p-type transistor, comprising:
      forming a second fin extending from the semiconductor substrate;
      forming a second gate dielectric layer on the second fin;
      forming a second capping layer on the first gate dielectric layer;

forming a second work-function layer on the second capping layer, wherein the second work-function layer extends conformally over the second capping layer, wherein the first work-function layer and the second work-function layer comprise the same work-function material, and wherein the first work-function layer has a first proportion of crystalline orientations and the second work-function layer has a second proportion of crystalline orientations; and forming the bulk metal on the second work-function layer.

16. The method of claim 15, wherein the work-function material comprises TiN.

17. The method of claim 15, wherein the work-function material comprises a dopant, wherein the dopant has a greater concentration in first regions of the work-function material having a first crystalline orientation than in second regions of the work-function material having a second crystalline orientation.

18. The method of claim 17, wherein the dopant is fluorine.

19. The method of claim 17, wherein the first crystalline orientation is (111) and the second crystalline orientation is (200).

20. The method of claim 15, wherein the first work-function layer has a thickness of less than about 20 Å.

* * * * *